(12) United States Patent
Kim

(10) Patent No.: US 12,419,051 B2
(45) Date of Patent: Sep. 16, 2025

(54) SEMICONDUCTOR MEMORY DEVICE AND MANUFACTURING METHOD OF SEMICONDUCTOR MEMORY DEVICE

(71) Applicant: SK hynix Inc., Icheon-si Gyeonggi-do (KR)

(72) Inventor: Jin Ha Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 353 days.

(21) Appl. No.: 18/097,001

(22) Filed: Jan. 13, 2023

(65) Prior Publication Data

US 2024/0023330 A1    Jan. 18, 2024

(30) Foreign Application Priority Data

Jul. 12, 2022    (KR) .................. 10-2022-0085345

(51) Int. Cl.
*H10B 43/27* (2023.01)
*G11C 16/04* (2006.01)
*H10B 41/27* (2023.01)

(52) U.S. Cl.
CPC ......... *H10B 43/27* (2023.02); *G11C 16/0483* (2013.01); *H10B 41/27* (2023.02)

(58) Field of Classification Search
None
See application file for complete search history.

(56) References Cited

U.S. PATENT DOCUMENTS

| | | | |
|---|---|---|---|
| 2007/0102749 A1* | 5/2007 | Shirota | H10B 41/40 257/314 |
| 2012/0051138 A1* | 3/2012 | Kim | H10B 41/27 365/189.05 |
| 2014/0334230 A1* | 11/2014 | Kwon | H10B 43/27 365/185.11 |
| 2016/0284410 A1* | 9/2016 | Lee | G11C 16/0483 |
| 2017/0213844 A1* | 7/2017 | Shin | H10D 1/00 |
| 2018/0175053 A1* | 6/2018 | Park | H10B 43/27 |
| 2022/0285372 A1* | 9/2022 | Choi | H10B 43/35 |

FOREIGN PATENT DOCUMENTS

| | | | | |
|---|---|---|---|---|
| JP | 2023136812 A | * | 9/2023 | .......... H01L 27/1157 |
| KR | 1020210060723 A | | 5/2021 | |
| KR | 1020210117392 A | | 9/2021 | |

* cited by examiner

*Primary Examiner* — Michael Lebentritt
(74) *Attorney, Agent, or Firm* — WILLIAM PARK AND ASSOCIATES LTD.

(57) ABSTRACT

There are provided a semiconductor memory device and a manufacturing method of a semiconductor memory device. The manufacturing method of the semiconductor memory device includes: stacking a plurality of first material layers and a plurality of second material layers over a preliminary doped semiconductor structure; forming a blocking insulating layer, a data storage layer, a tunnel insulating layer, and a channel layer, which penetrate the plurality of first and second material layers, and extend to the inside of the preliminary doped semiconductor structure; forming a slit penetrating the plurality of first and second material layers; forming a protective structure as a double layer or a single layer on a sidewall of the slit; and forming a doped channel contact layer which penetrates a portion of the preliminary doped semiconductor structure in a direction intersecting the channel layer, and is in contact with the channel layer.

15 Claims, 20 Drawing Sheets

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2022-0085345 filed on Jul. 12, 2022, in the Korean Intellectual Property Office, the entire disclosure of which is incorporated by reference herein.

BACKGROUND

1. Technical Field

The present disclosure generally relates to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device may include a plurality of memory cells capable of storing data. A plurality of memory cells of a three-dimensional semiconductor memory device may be three-dimensionally arranged. In the three-dimensional semiconductor memory device, the plurality of memory cells may be connected in series by a channel structure penetrating a gate stack structure. The channel layer of the three-dimensional semiconductor memory device may be electrically connected to a doped semiconductor structure overlapping with the gate stack structure.

SUMMARY

In accordance with an embodiment of the present disclosure, there may be provided a method of manufacturing a semiconductor memory device, the method may include: alternately stacking a plurality of first material layers and a plurality of second material layers in a first direction over a preliminary doped semiconductor structure; forming a hollowed blocking insulating layer penetrating the plurality of first material layers and the plurality of second material layers, the hollowed blocking insulating layer extending to the inside of the preliminary doped semiconductor structure; forming a plurality of data storage patterns on levels where the plurality of second material layers are disposed, wherein an inner wall of the hollowed blocking insulating layer is partially covered by the plurality of data storage patterns; forming a hollowed tunnel insulating layer to cover the plurality of data storage patterns and the inner wall of the hollowed blocking insulating layer; forming a channel layer inside the hollowed tunnel insulating layer; forming a slit penetrating the plurality of first material layers and the plurality of second material layers; forming a protective structure as one of a double layer and a single layer on a sidewall of the slit; and forming a doped channel contact layer penetrating a portion of the preliminary doped semiconductor structure in a direction intersecting the channel layer, the doped channel contact layer being in contact with the channel layer.

In accordance with an embodiment of the present disclosure, there may be provided a semiconductor memory device including: a doped semiconductor structure; a gate stack structure including a plurality of conductive layers stacked in a first direction over the doped semiconductor structure; a channel layer including a first part and a second part extending in a first direction from the first part to penetrate the gate stack structure; a first tunnel insulating pattern extending along an outer wall of the second part of the channel layer; a plurality of data storage patterns interposed between the plurality of conductive layers and the first tunnel insulating pattern; and a first blocking insulating pattern interposed between each of the plurality of data storage pattern and the gate stack structure, wherein at least a portion of the first part is located inside the doped semiconductor structure, wherein the doped semiconductor structure includes a contact surface in contact with the channel layer, and wherein the first blocking insulating pattern extends to a first region between a lowermost conductive layer adjacent to the doped semiconductor structure among the plurality of conductive layer and the contact surface, and is in contact with the first tunnel insulating pattern in the first region.

BRIEF DESCRIPTION OF THE DRAWINGS

Various examples of embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or additional intervening elements may also be present. Like reference numerals refer to like elements throughout the drawings.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements. It will be understood that when a structure, element, or layer etc., is referred to as being "on," "connected to" or "coupled to" another structure, element, or layer etc., it can be directly on, connected or coupled to the other structure, element, or layer etc., or intervening structures, elements, or layers etc., may be present. In contrast, when a structure, element, or layer etc., is referred to as being "directly on," "directly connected to" or "directly coupled to" another structure, element, or layer etc., there are no intervening structures, elements, or layers etc., present. In some embodiments, it will be understood that when a layer, structure, or element etc., is referred to as penetrating another layer, structure, or element etc., it can partially penetrate the other layer, structure, or element etc., by extending into a portion of the other layer, structure, or element etc., or completely penetrate the other layer, structure, or element etc., by passing through the entire layer, structure, or element etc.

Various embodiments provide a semiconductor memory device and a manufacturing method of a semiconductor memory device, which may simplify a manufacturing process.

Figure 1:
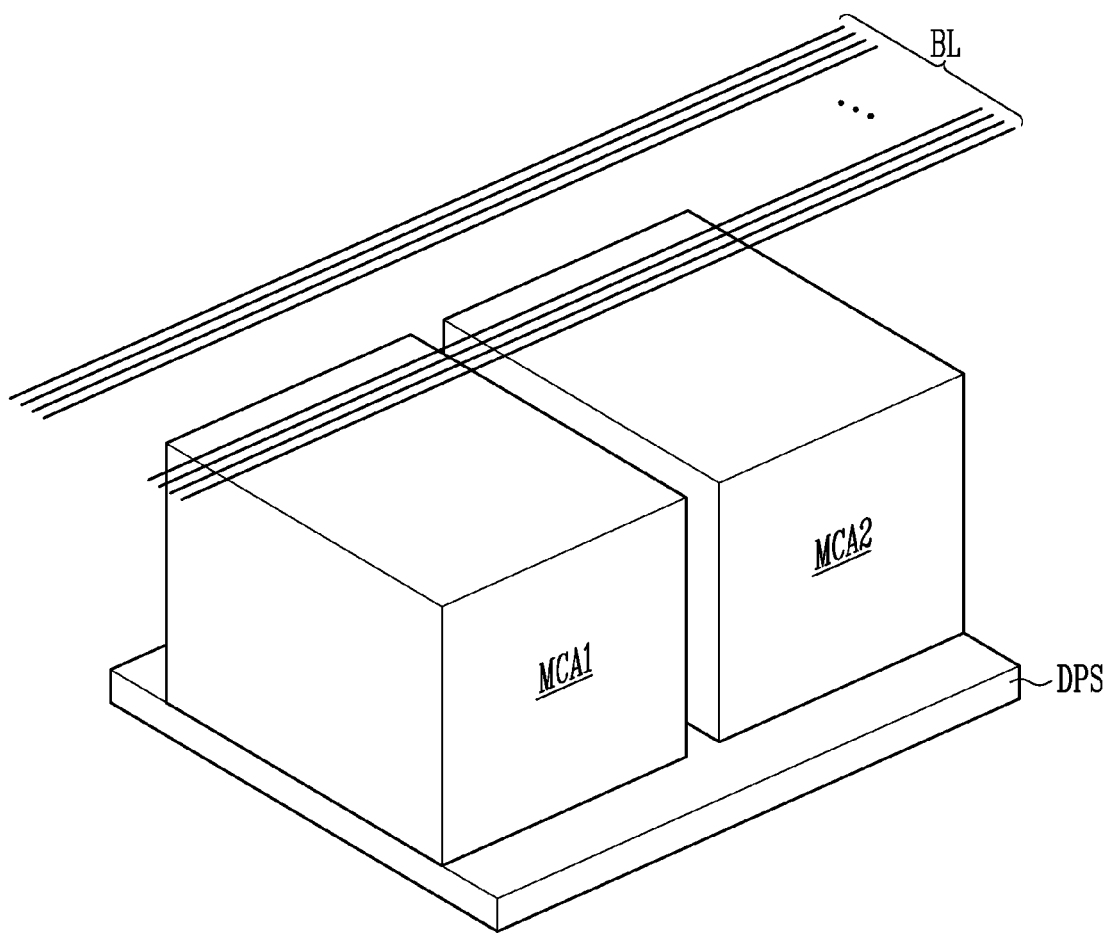
FIG. 1 is a diagram schematically illustrating a semiconductor memory device in accordance with an embodiment of the present disclosure.

FIG. 1 is a diagram schematically illustrating a semiconductor memory device in accordance with an embodiment of the present disclosure.

Referring to FIG. 1, the semiconductor memory device may include a doped semiconductor structure DPS, a plurality of memory cell arrays MCA1 and MCA2, and a plurality of bit lines BL. The plurality of memory cell arrays MCA1 and MCA2 may be disposed between the doped semiconductor structure DPS and the plurality of bit lines BL.

Each of the plurality of memory cell arrays MCA1 and MCA2 may include a plurality of memory cell strings connected to the doped semiconductor structure DPS. Each memory cell string may be connected to a plurality of conductive layers of a gate stack structure corresponding thereto. The plurality of memory cell arrays MCA1 and MCA2 may include a first memory cell array MCA1 and a second memory cell array MCA2 adjacent to each other on a plane parallel to a top surface of the doped semiconductor structure DPS. A gate stack structure of the first memory cell array MCA1 and a gate stack structure of the second memory cell array MCA2 may be isolated from each other by a slit.

Each bit line BL may be connected to a memory cell string of the first memory cell array MCA1 and a memory cell string of the second memory cell array MCA2. Each memory cell string may include a channel layer connected to a bit line BL corresponding thereto and the doped semiconductor structure DPS.

Although not shown in the drawing, the semiconductor memory device may further include a peripheral circuit structure for controlling the plurality of memory cell arrays MCA1 and MCA2, the plurality of bit lines BL, and the doped semiconductor structure DPS. In an embodiment, the peripheral circuit structure may be disposed adjacent to the plurality of bit lines BL. An interconnection may be disposed between the peripheral circuit structure and the plurality of bit lines BL, or an interconnection and a bonding structure may be disposed between the peripheral circuit structure and the plurality of bit lines BL. In another embodiment, the peripheral circuit structure may be disposed adjacent to the doped semiconductor structure DPS. An interconnection may be disposed between the peripheral circuit structure and the doped semiconductor structure DPS, or an interconnection and a bonding structure may be disposed between the peripheral circuit structure and the doped semiconductor structure DPS.

A manufacturing process of the semiconductor memory device may be various. In an embodiment, a process of forming the doped semiconductor structure DPS, a process of forming the plurality of memory cell arrays MCA1 and MCA2, and a process of forming the plurality of bit lines BL may be performed on the peripheral circuit structure (not shown). In another embodiment, a first structure including the plurality of memory cell arrays MCA1 and MCA2 may be formed separately from the second structure including the peripheral circuit structure (not shown). The first structure and the second structure may be structurally connected to each other through a bonding structure. The bonding structure may include a first bonding insulating layer disposed at the first structure, a second bonding insulating layer disposed at the second structure, a first conductive bonding pad inside the first bonding insulating layer, and a second conductive bonding pad inside the second bonding insulating layer. The first bonding insulating layer may be coupled to the second bonding insulating layer, and the first conductive bonding pad may be coupled to the second conductive bonding pad. The first conductive bonding pad may be electrically connected to the peripheral circuit structure via an interconnection corresponding thereto, and the second conductive bonding pad may be electrically connected to a memory cell array corresponding thereto via an interconnection corresponding thereto.

Figure 2:
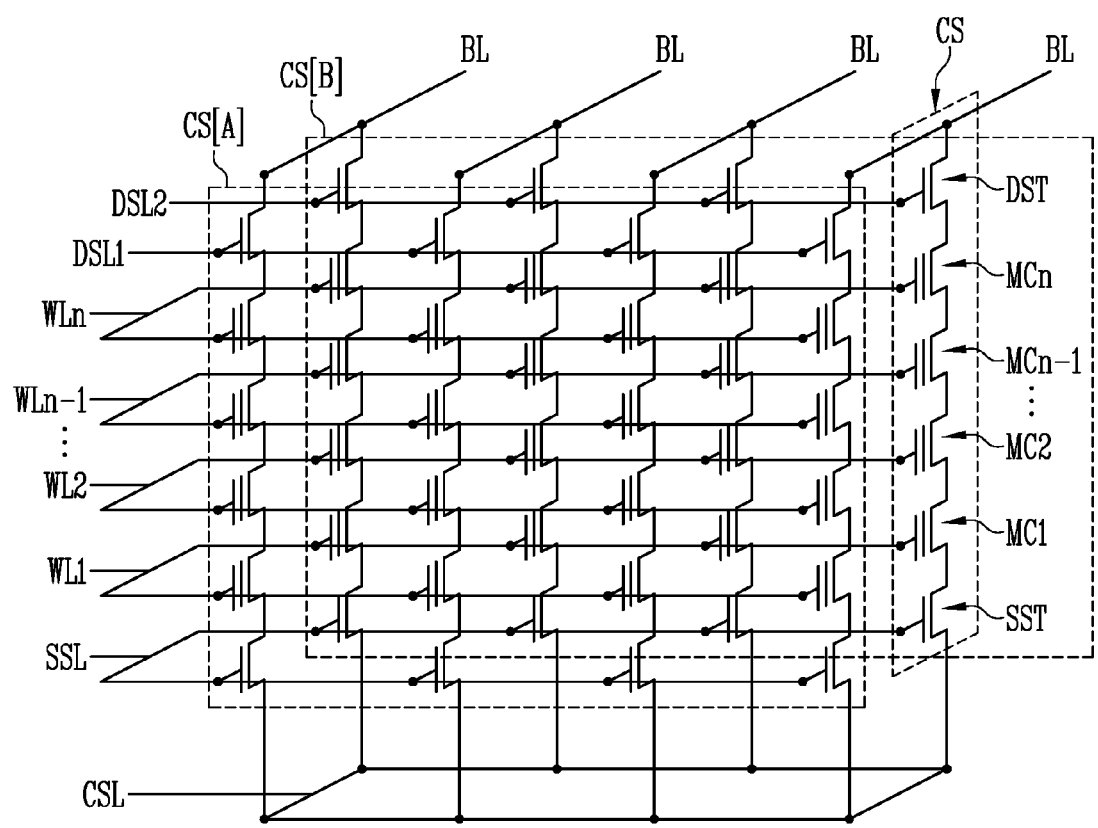
FIG. 2 is a circuit diagram of a memory cell array in accordance with an embodiment of the present disclosure.

FIG. 2 is a circuit diagram of a memory cell array in accordance with an embodiment of the present disclosure.

Referring to FIG. 2, a plurality of memory cell strings CS of the memory cell array may be connected in parallel to a common source line CSL, The common source line CSL may be connected to the plurality of memory cell strings CS via the doped semiconductor structure DPS shown in FIG. 1.

Each memory cell string CS may include at least one source select transistor SST, a plurality of memory cells MC1 to MCn, and at least one drain select transistor DST, The plurality of memory cells MC1 to MCn may be connected in series between the source select transistor SST and the drain select transistor DST. The source select transistor SST, the plurality of memory cells MC1 to MCn, and the drain select transistor DST may be connected in series by a channel layer.

Each memory cell string CS may be connected to a bit line corresponding thereto among a plurality of bit lines BL. The common source line CSL and the plurality of bit lines BL may be connected to channel layers of the plurality of memory cell strings CS.

The plurality of memory cells MC1 to MCn of the memory cell string CS may be connected to the common source line CSL via the source select transistor SST and the doped semiconductor structure DPS shown in FIG. 1. The plurality of memory cells MC1 to MCn of the memory cell string CS may be connected to a bit line BL corresponding thereto via the drain select transistor DST.

The memory cell string CS may be connected to a source select line SSL, a plurality of word lines WL1 to WLn, and a drain select line DSL1 or DSL2. The source select line SSL may be used a gate electrode of the source select transistor SST. The plurality of word lines WL1 to WLn may be used as gate electrodes of the plurality of memory cells MC1 to MCn. The drain select line DSL1 or DSL2 may be used as a gate electrode of the drain select transistor DST.

The plurality of memory cell strings CS may be controlled by each of the plurality of word lines WL1 to WLn. Two or more memory cell strings CS may be controlled by each bit line BL. In an embodiment, one memory cell string CS of a first memory cell string group CS[A] and one memory cell string CS of a second memory cell string group CS[B] may be connected to each bit line BL, The first memory cell string group CS[A] and the second memory cell string group CS[B] may be individually controlled by drain select lines isolated from each other or source select lines isolated from each other. In an embodiment, the first memory cell string group CS[A] may be connected to a first drain select line DSL1, and the second memory cell string group CS[B] may be connected to a second drain select line DSL2. The first memory cell string group CS[A] and the second memory cell string group CS[B] may be connected to the same source select line SSL, However; the embodiments of the present disclosure is not limited thereto. In other embodiments, two or more memory cell string groups connected to the same bit line BL may be connected to the same drain select line, and be individually connected to two or more source select lines isolated from each other. In still other embodiments, two or more memory cell string groups connected to the same bit line BL may be individually connected to two or more drain select lines isolated from each other, and be individually connected to two or more source select lines isolated from each other.

An operating voltage for precharging a channel layer of a memory cell string CS corresponding to each bit line BL may be applied to the bit line BL, The bit line BL may be connected to the channel layer of the memory cell string CS through a bit line connection structure.

An operating voltage for discharging a potential of the channel layer of the memory cell string CS may be applied to the common source line CSL.

Figure 3:
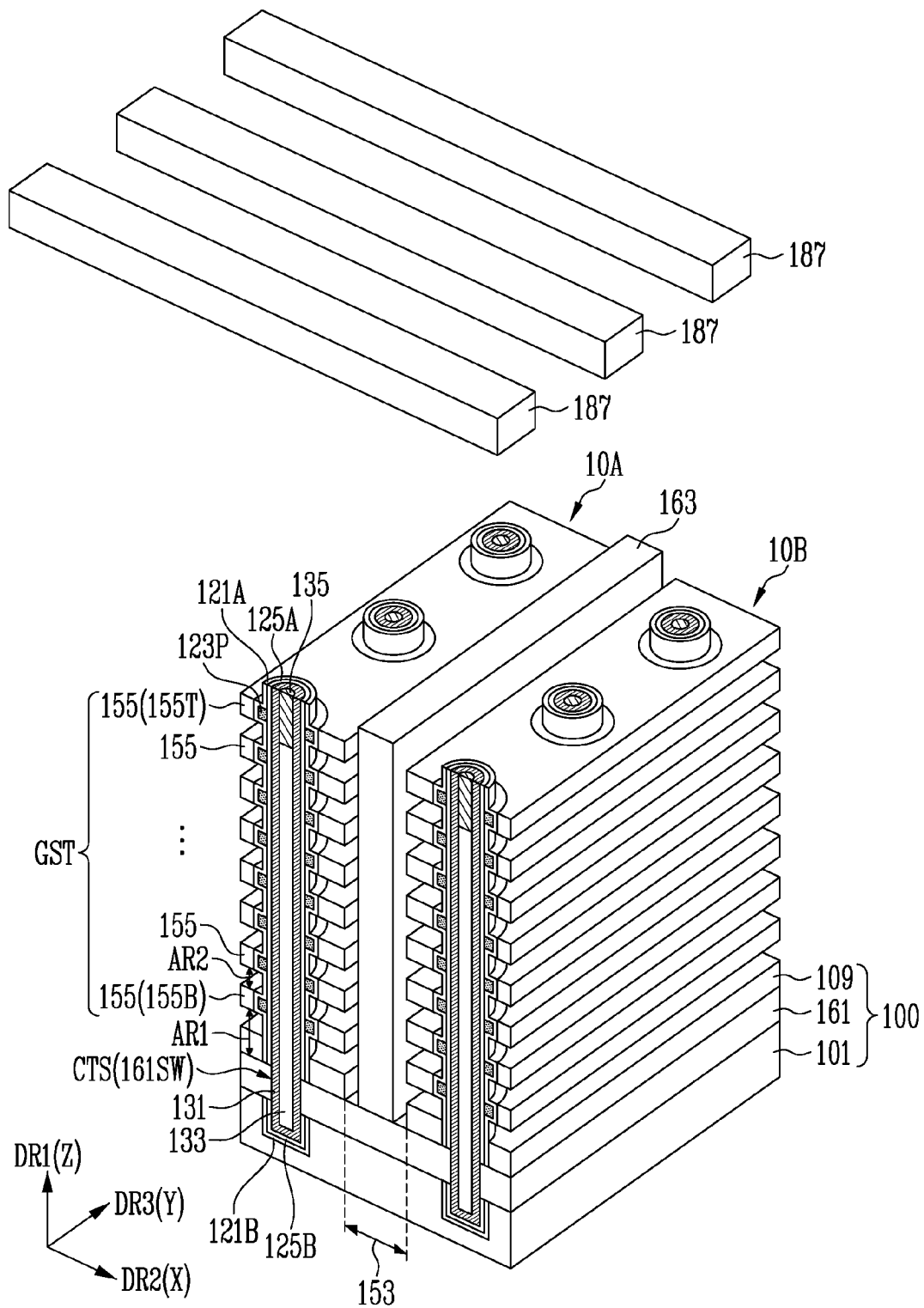
FIG. 3 is a perspective view illustrating a semiconductor memory device in accordance with an embodiment of the present disclosure.
Figure 4:
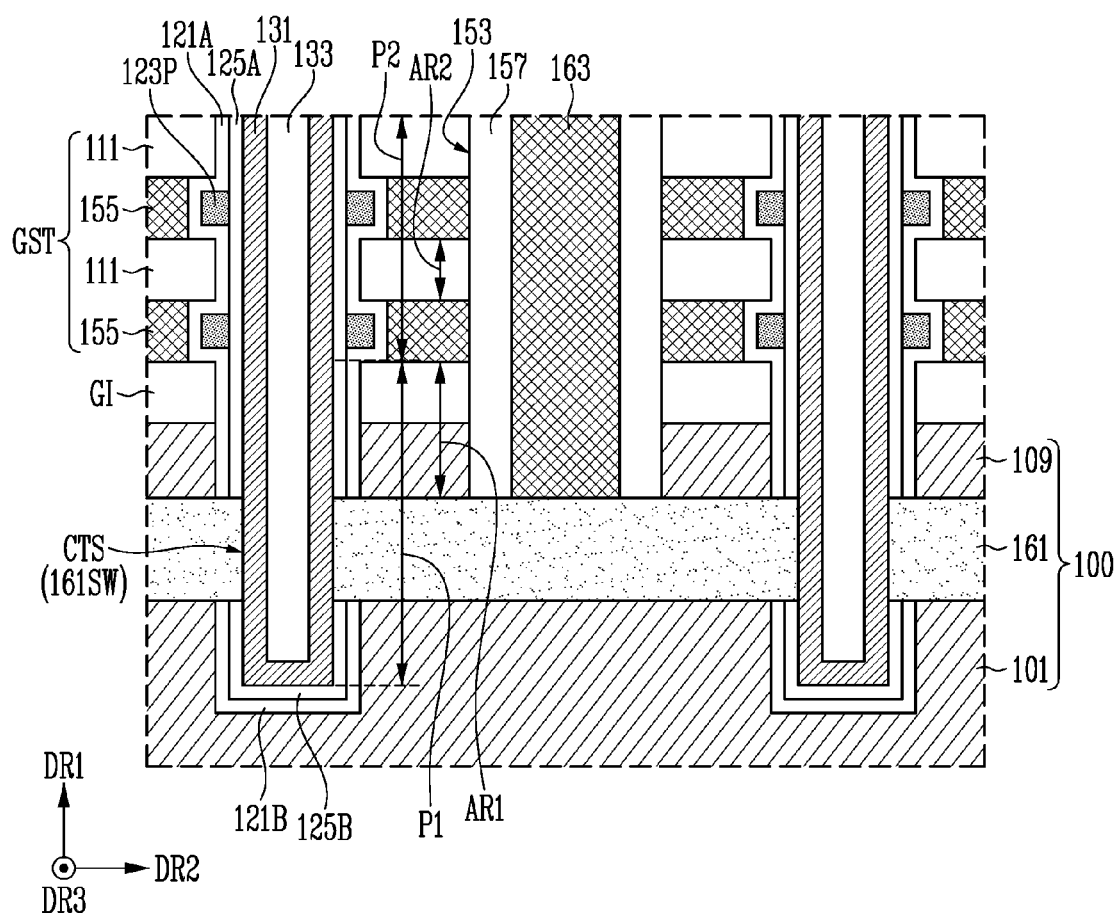
FIG. 4 is an enlarged sectional view of a portion of the semiconductor memory device shown in FIG. 3.

FIG. 3 is a perspective view illustrating a semiconductor memory device in accordance with an embodiment of the present disclosure. FIG. 4 is an enlarged sectional view of a portion of the semiconductor memory device shown in FIG. 3.

Referring to FIGS. 3 and 4, the semiconductor memory device may include a plurality of gate stack structures GST disposed over a doped semiconductor structure 100 and a plurality of channel layers 131 which penetrate the plurality of gate stack structures GST and extend to the inside of the doped semiconductor structure 100. A first tunnel insulating pattern 125A, a first blocking insulating pattern 121A, and a plurality of data storage patterns 123P may be interposed between each gate stack structure GST and a channel layer corresponding thereto. A plurality of bit lines 187 may be disposed above the plurality of gate stack structures GST.

The doped semiconductor structure 100 may include a contact surface CTS in contact with the channel layer 131. More specifically, the doped semiconductor structure 100 may include a lower layer 101, a doped channel contact layer 161, and an upper layer 109. The doped channel contact layer 161 may include a sidewall 161SW corresponding to the contact surface CTS, The doped channel contact layer 161 may be disposed on the lower layer 101. The upper layer 109 may be disposed between the gate stack structure GST and the doped channel contact layer 161. The upper layer 109 may be spaced apart from the lower layer 101 in a first direction DR1 with the doped channel contact layer 161 interposed therebetween. The upper layer 109 may be omitted in some embodiments.

Each of the lower layer 10 the doped channel contact layer 161, and the upper layer 109 may include a doped semiconductor layer. Each of the lower layer 101, the doped channel contact layer 161, and the upper layer 109 may include at least one of an n-type impurity and a p-type impurity.

The semiconductor memory device may include a source contact structure 163 inside a slit 153, The source contact structure 163 may be in contact with the doped channel contact layer 161 and may extend in the first direction DR1, The source contact structure 163 may be formed of the same material as the doped channel contact layer 161, or be formed of various conductive materials including a metal. The source contact structure 163 may be provided to electrically connect the doped semiconductor structure 100 to the common source line CSL shown in FIG. 2.

The plurality of gate stack structures GST may be disposed between the doped semiconductor structure 100 and the plurality of bit lines 187. The plurality of gate stack structures GST may be partitioned by the slit 153. FIGS. 3 and 4 illustrate a portion of each gate stack structure GST adjacent to slit 153. Each of the plurality of gate stack structures GST may include a plurality of conductive layers 155. The plurality of conductive layers 155 may be provided as a plurality of gate electrodes of a memory cell array corresponding thereto. In an embodiment, the semiconductor memory device may include a first memory cell array 10A and a second memory cell array 10B, which are disposed at both sides of the slit 153. A gate stack structure GST of each of the first memory cell array 10A and the second memory cell array 10B may include a plurality of conductive layers 155 stacked over the doped semiconductor structure 100, In an embodiment, a gate insulating layer GI may be located between the plurality of conductive layers 155 and the doped semiconductor structure 100 as, for example, shown in FIG. 4. A sidewall insulating layer 157 may be disposed between the source contact structure 163 and the gate stack structure GST. The source contact structure 163 may be insulated from the plurality of conductive layers 155 of the gate stack structure GST by the sidewall insulating layer 157.

The plurality of conductive layers 155 may be stacked to be spaced apart from each other in the first direction DR1. Each conductive layer 155 may have a flat plate shape extending in a second direction DR2 and a third direction DR3. In an embodiment, the second direction DR2 and the third direction DR3 may respectively correspond to an X-axis direction and a Y-axis direction, and the first direction DR1 may correspond to a Z-axis direction.

The plurality of conductive layers 155 may be used as the source select line SSL, the plurality of word lines WL1 to WLn, and the drain select line DSL1 or DSL2, which are shown in FIG. 2. At least one conductive layer 155 adjacent to the doped semiconductor structure 100 among the plurality of conductive layers 155 may be used as the source select line. In an embodiment, a lowermost conductive layer 155B adjacent to the doped semiconductor structure 100 among the plurality of conductive layers 155 may be used as the source select line. At least one conductive layer adjacent to the bit line 187 among the plurality of conductive layers 155 may be used as the drain select line. In an embodiment, an uppermost conductive layer 155T adjacent to the bit line 187 among the plurality of conductive layers 155 may be used as the drain select line. The other conductive layers between the conductive layer (e.g., 155T) used as the drain select line and the conductive layer (e.g., 155B) used as the source select line may be used as the word lines. The lowermost conductive layer 155B may be spaced apart from the doped semiconductor structure 100 by the gate insulating layer GI.

The gate stack structure GST may further include a plurality of interlayer insulating layers 111 alternately disposed in the first direction DR1 with the plurality of conductive layers 155. A plurality of conductive layers 155 adjacent to each other in the first direction DR1 may be insulated from each other by a plurality of interlayer insulating layers 111. Each conductive layer 155 may include at least one of a doped semiconductor layer, a metal layer, and a conductive metal nitride layer. The doped semiconductor layer may include a doped silicon layer. The metal layer may include tungsten, copper, molybdenum, and the like. The conductive metal nitride layer may include titanium nitride, tantalum nitride, and the like.

The channel layer 131 may be formed of a semiconductor material such as silicon or germanium. In an embodiment, the channel layer 131 may include a substantially intrinsic semiconductor. A partial region of the channel layer 131, which forms the contact surface CTS with the doped semiconductor structure 100, and a partial region of the channel layer 131, which is adjacent thereto, may be defined as a source junction. The source junction may include, as a majority carrier, an impurity having the same conductivity type as the channel contact layer 161. In an embodiment, the source junction may include an n-type impurity. In addition, another partial region of the channel layer 131 may be defined as a drain junction. A top end of the channel layer 131, which is adjacent to the bit line 187, may be defined as the drain junction. The drain junction may include at least one of an n-type impurity and a p-type impurity. In an embodiment, the drain junction may include the n-type impurity as a majority carrier.

The channel layer 131 may be formed in various structures such as a pillar structure and a hollow structure. When the channel layer 131 is formed in a hollow structure, a core insulating layer 133 and a capping semiconductor layer 135 may be disposed inside the hollowed portion of the channel layer 131, as for example, shown in FIG. 3. The capping semiconductor layer 135 may be disposed at the top end of the hollowed portion of the channel layer 131 adjacent to the bit line 187, and overlap with the core insulating layer 133, The capping semiconductor layer 135 may include an impurity having the same conductivity type as the drain junction. In an embodiment, the capping semiconductor layer 135 may include an n-type impurity.

The channel layer 131 may be used as a channel region of a memory cell string corresponding thereto, and a potential of channels inside the channel layer 131 may be changed by a voltage applied to the plurality of conductive layers 155.

The channel layer 131 may include a first part P1 inside the doped semiconductor structure 100 and a second part P2 inside the gate stack structure GST. The first part P1 may penetrate the upper layer 109 and the doped channel contact layer 161 of the doped semiconductor structure 100, and extend to the inside of the lower layer 101 of the doped semiconductor structure 100. Also, the first part P1 may penetrate the gate insulating layer GI. The first part P1 may for the contact surface CTS with the doped channel contact layer 161, Accordingly, the doped semiconductor structure 100 may be electrically connected to the channel layer 131 through the channel contact layer 161. The second part P2 may extend in the first direction DR1 from the first part P1 to penetrate the gate stack structure GST.

The first tunnel insulating pattern 125A may be interposed between the channel layer 131 and the gate stack structure GST, to extend along an outer wall of the second part P2 of the channel layer 131, The first tunnel insulating pattern 125 may be formed of an insulating material through which charges can tunnel. In an embodiment, the first tunnel insulating pattern 125A may include silicon oxide.

The plurality of data storage patterns 123P may be interposed between the plurality of conductive layers 155 and the first tunnel insulating pattern 125A. The plurality of data storage patterns 123P may be formed of a material layer capable of storing data changed using Fowler-Nordheim tunneling, To this end, each data storage pattern 123P may include at least one of a charge trap layer, a floating gate layer, and an insulating layer including a conductive nano dot. The charge trap layer may include silicon nitride, and the floating gate layer may include a silicon layer.

The plurality of data storage patterns 123P may be divided into a pattern used as a charge storage layer of a memory cell and a pattern as a gate insulating layer. A pattern corresponding to the conductive layer used as the word line among the plurality of data storage patterns 123P may be used as the charge storage layer, and a pattern corresponding to the conductive layers used as the drain select line and the source select line among the plurality of data storage patterns 123P may be used as the gate insulating layer.

The plurality of data storage patterns 123P may be disposed between the doped semiconductor structure 100 and the first part P1 of the channel layer 131, In an embodiment, each of the plurality of data storage patterns 123P may be respectively disposed at levels at which the plurality of conductive layers 155 of the gate stack structure GST are disposed, To this end, the plurality of interlayer insulating layers 111 may further protrude toward the channel layer 131 than the plurality of conductive layers 155, The plurality of data storage patterns 123P may be disposed between protrusion parts of the plurality of interlayer insulating layers 111, and be isolated from each other in the first direction DR1 by the plurality of interlayer insulating layers 111. The structure for disposing the plurality of data storage patterns 123P between the doped semiconductor structure 100 and the channel layer 131 is not limited to the above-described embodiments. Although not shown in the drawings, the plurality of data storage patterns 123P formed of an insulating material may extend between each of the plurality of interlayer insulating layers 111 and the gate insulating layer GI, and the first tunnel insulating pattern 125A to be connected to each other over the doped semiconductor structure 100. Hereinafter, for convenience of description, the present disclosure is described based on various embodiments in which the plurality of data storage patterns 123P are spaced apart from each other in the first direction DR1.

The first blocking insulating pattern 121A may be interposed between each of the plurality of data storage patterns 123P and the gate stack structure GST. The first blocking insulating pattern 121A may extend to a first region AR1 between the contact surface CTS and the lowermost conductive layer 155B. The first blocking insulating pattern 121A may be in contact with the first tunnel insulating pattern 125 in the first region AR1. More specifically, the first blocking insulating pattern 121A and the first tunnel insulating pattern 125A may extend between the first part P1 of the channel layer 131 and the upper layer 109 of the doped semiconductor structure 100, and be in contact with each other between the first part P1 of the channel layer 131 and the upper layer 109. The first blocking insulating pattern 121A may extend to a second region AR2 between conductive layers 155 adjacent to each other in the first direction DR1. When the plurality of data storage patterns 123P are disposed to be spaced apart from each other in the first direction DR1, the first blocking insulating pattern 121A and the first tunnel insulating pattern 125A may be in contact with each other in the second region AR2. That is, the first blocking insulating pattern 121A and the first tunnel insulating pattern 125A may be in contact with each other between the plurality of interlayer insulating layers 111 and the second part P2 of the channel layer 131.

The first blocking insulating pattern 121A may include an insulating material capable of blocking charges. In an embodiment, the first blocking insulating pattern 121A may include at least one of silicon oxide and metal oxide. The first blocking insulating pattern 121A may extend to the first region AR1 between the contact surface CTS and the lowermost conductive layer 155B.

The semiconductor memory device may further include a second blocking insulating pattern 121B and a second tunnel insulating pattern 125B, which are interposed between the lower layer 101 of the doped semiconductor structure 100 and the first part P1 of the channel layer 131, The second blocking insulating pattern 1213 may be formed of the same material as the first blocking insulating pattern 121A and may be spaced apart from the first blocking insulating pattern 121A by the doped channel contact layer 161. The second tunnel insulating pattern 125B may be formed of the same material as the first tunnel insulating pattern 125A and may be spaced apart from the first tunnel insulating pattern 125A by the doped channel contact layer 161.

The second tunnel insulating pattern 125B may be interposed between the first part P1 of the channel layer 131 and the lower layer 101, The second blocking insulating pattern 121B may be interposed between the second tunnel insulating pattern 125B and the lower layer 101. The second tunnel insulating pattern 125B and the second blocking insulating pattern 121B may be in contact with each other.

The plurality of bit lines 187 may be conductive patterns. The plurality of bit lines 187 may extend in a direction intersecting the plurality of gate stack structures GST. In an embodiment, the plurality of gate stack structures GST may be spaced apart from each other in the second direction DR2 by the slit 153 extending in the third direction DR3, and the plurality of bit lines 187 may extend in the second direction DR2, The plurality of bit lines 187 may be spaced apart from the source contact structure 163. Although not shown in the drawings, each of the plurality of bit lines 187 may be connected to a channel layer 131 and a capping semiconductor layer 135, which correspond thereto through a bit line connection structure formed of a conductive material.

A protective structure may be formed on a sidewall of the slit 153 in a process of manufacturing the above-described semiconductor memory device. The protective structure may be designed by considering material layers interposed between the channel layer 131 and the doped semiconductor structure 100. In an embodiment of the present disclosure, oxide-based material layers such as the first tunnel insulating pattern 125A, the first blocking insulating pattern 121A, the second tunnel insulating pattern 125B, and the second blocking insulating pattern 121 may be interposed between the doped semiconductor structure 100 and the channel layer 131, and a material having an etch selectivity with respect to the data storage pattern 123P may be excluded in the protective structure. In consideration of this, although the protective structure is simplified as a double layer or a single layer, various embodiments of the present disclosure may provide a manufacturing method of the semiconductor memory device, which can stably perform a process. A manufacturing method of a semiconductor memory device in accordance with an embodiment of the present disclosure will be described in more detail with reference to the following drawings.

FIGS. 5A to 5D are sectional views illustrating some processes of a manufacturing method of a semiconductor memory device in accordance with an embodiment of the present disclosure.

Figure 5A:
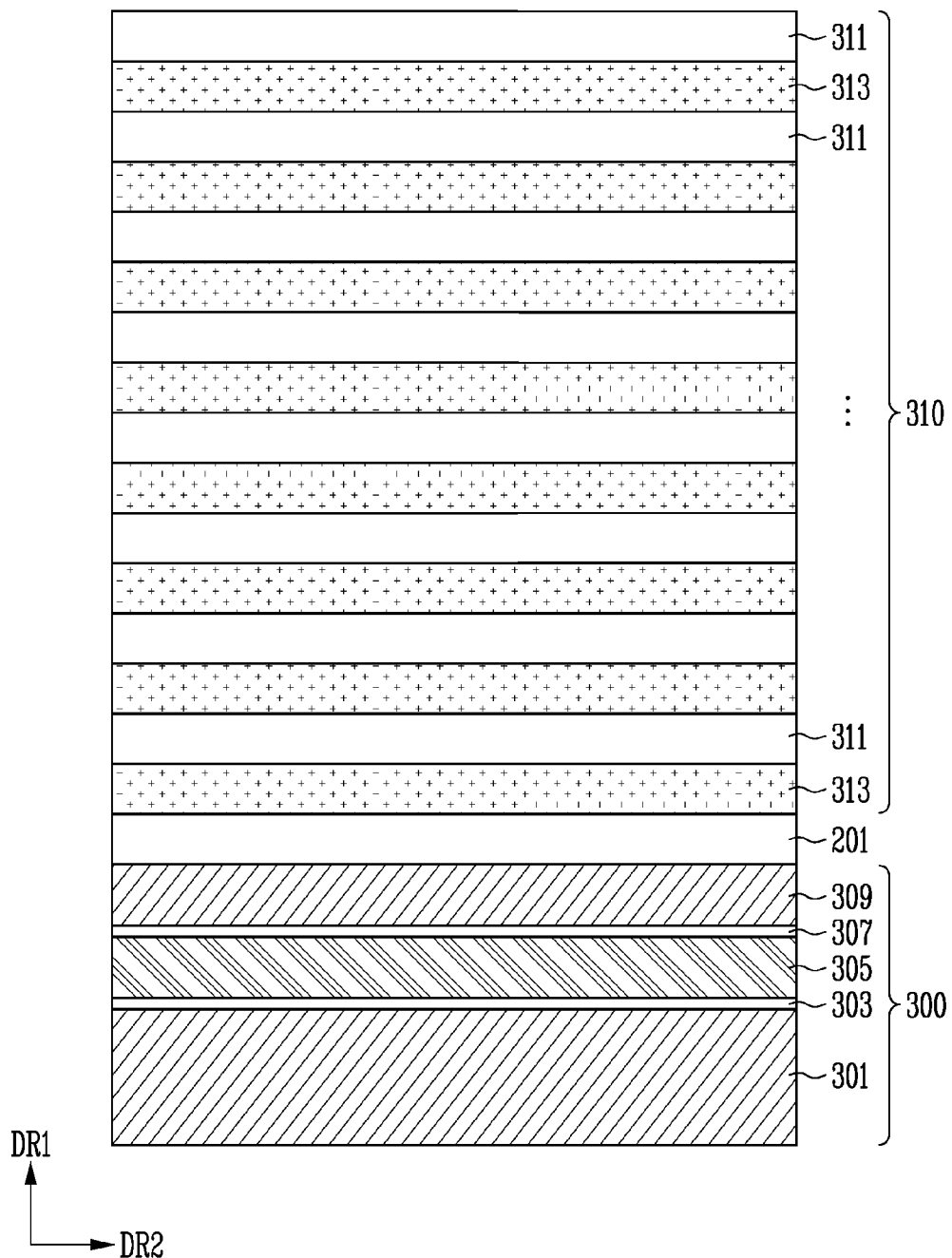
FIGS. 5A, 5B, 5C, and 5D are sectional views illustrating some processes of a manufacturing method of a semiconductor memory device in accordance with an embodiment of the present disclosure.

Referring to FIG. 5A, a preliminary doped semiconductor structure 300 may be formed on a lower structure (not shown). Although not shown in the drawing, the lower structure may be a peripheral circuit structure or a sacrificial substrate.

The preliminary doped semiconductor structure 300 may include a lower layer 301, a sacrificial layer 305, and an upper layer 309, which are stacked in the first direction DR1. The preliminary doped semiconductor structure 300 may further include a lower protective layer 303 between the lower layer 301 and the sacrificial layer 305 and an upper protective layer 307 between the sacrificial layer 305 and the upper layer 309, The lower protective layer 303 and the upper protective layer 307 may be formed of an oxide-based material. The sacrificial layer 305 may be formed of a material having an etch selectivity with respect to the lower protective layer 303 and the upper protective layer 307, In an embodiment, the sacrificial layer 305 may be formed of an undoped silicon layer. When the sacrificial layer 305 has an etch selectivity with respect to the lower protective layer 303 and the upper protective layer 307, the lower protective layer 303 and the upper protective layer 307 may be omitted. In an embodiment, the sacrificial layer 305 may include a metal having an etch selectivity with respect to the lower protective layer 303 and the upper protective layer 307.

The lower layer 301 may be formed of a doped semiconductor layer. The upper layer 309 may be formed of a material having an etch selectivity with respect to a preliminary gate stack structure 310 to be formed subsequently. In an embodiment, the upper layer 309 may be formed of a semiconductor layer such as silicon.

Subsequently, a plurality of first material layers 201 and 311 and a plurality of second material layers 313 may be alternately stacked in the first direction DR1 over the preliminary doped semiconductor structure 300. The plurality of first material layers 201 and 311 may include a gate insulating layer 201 and a plurality of interlayer insulating layers 311. The gate insulating layer 201 and the plurality of interlayer insulating layers 311 may include oxide such as a silicon oxide layer. The gate insulating layer 201 may be formed to have a thickness thinner than a thickness of each of the plurality of interlayer insulating layers 311, The plurality of second material layers 313 may be formed of a material different from the material of the plurality of first material layers 201 and 311. In an embodiment, the second material layer 313 may be a conductive layer including at least one of a doped semiconductor layer, a metal layer, and a conductive metal nitride layer. In another embodiment, the second material layer 313 may be provided as a sacrificial material having an etch selectivity with respect to the plurality of first material layers 201 and 311. The second material layer 313 may be formed of silicon nitride. The plurality of interlayer insulating layers 311 and the plurality of second material layers 313 may be provided as the preliminary gate stack structure 310.

Figure 5B:
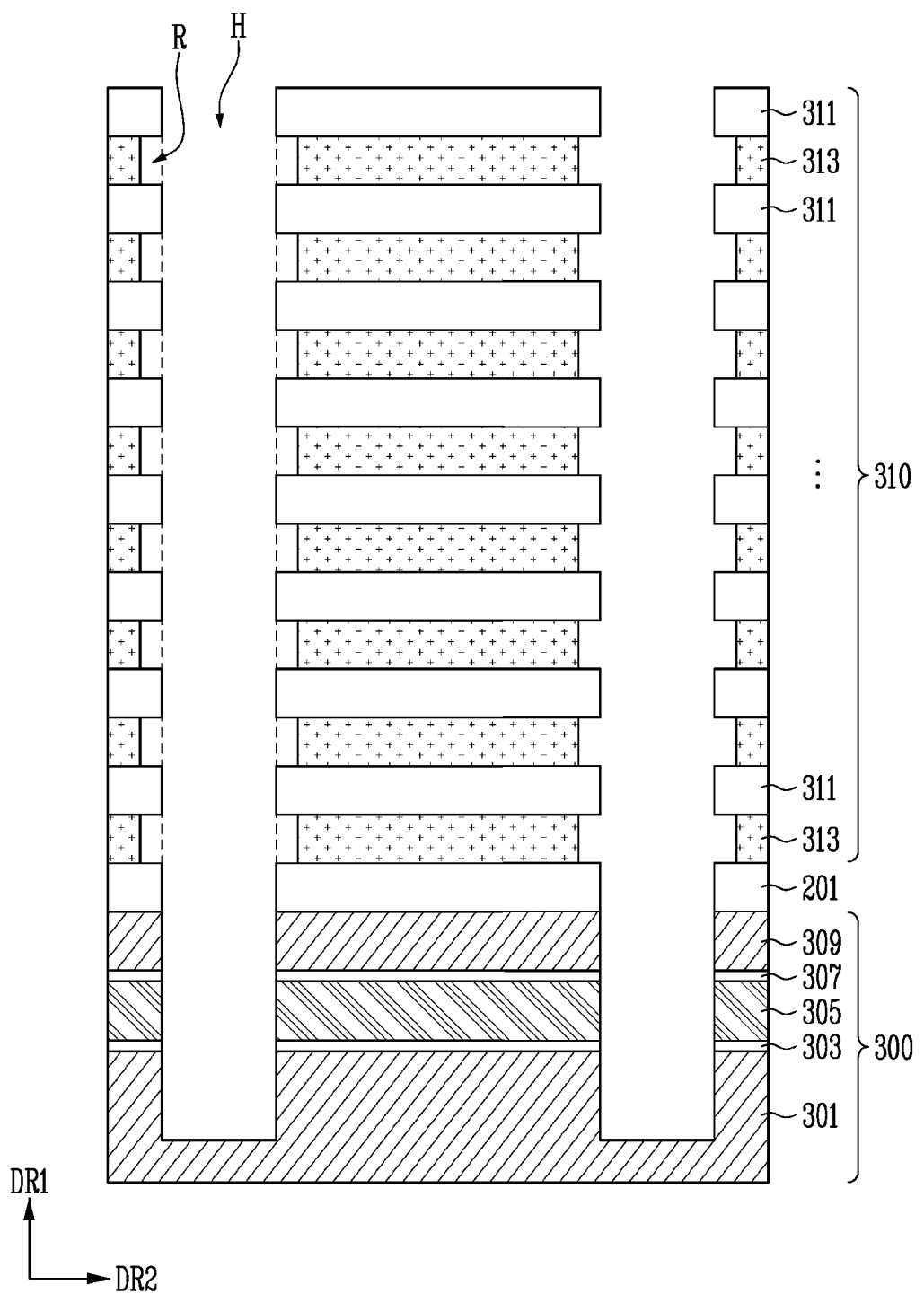

Referring to FIG. 5B, a plurality of holes H may be formed. The plurality of holes H may penetrate the plurality of first material layers 201 and 311 and the plurality of second material layers 313 and may extend to the inside of the preliminary doped semiconductor structure 300. To this end, each of the plurality of first material layers 201 and 311, the plurality of second material layers 313, the upper layer 309, the upper protective layer 307, the sacrificial layer 305, and the lower protective layer 303 may be locally etched through an etching process using a photolithography process. The etching process may be controlled such that the plurality of holes H may extend to the inside of the lower layer 301.

Subsequently, a plurality of recess regions R may be formed between the plurality of first material layers 201 and 311 by recessing the plurality of second material layers 313 exposed through the plurality of holes H, using a selective etching process.

Figure 5C:
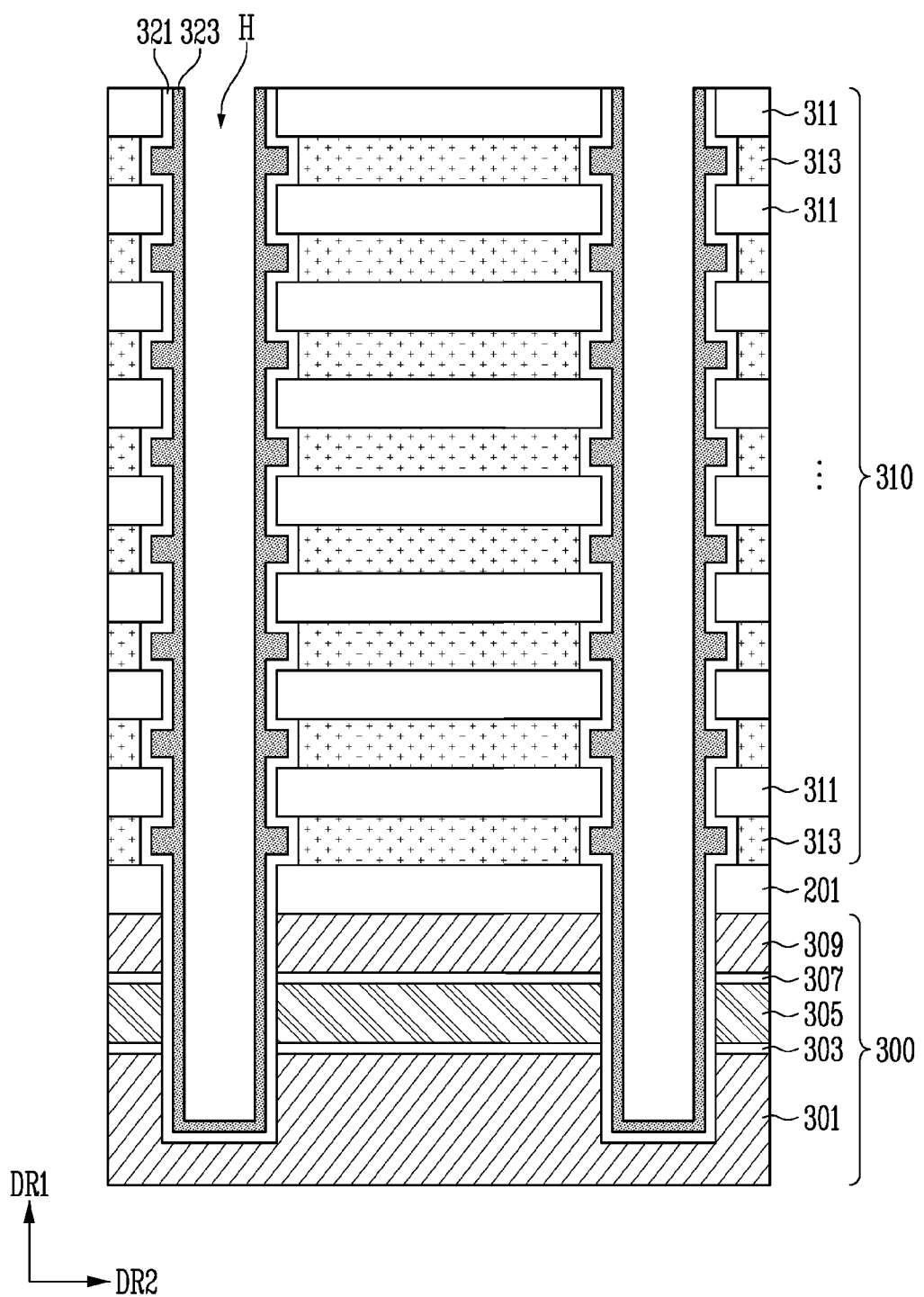

Referring to FIG. 5C, a hollowed blocking insulating layer 321 may be formed along surfaces of each hole H and a plurality of recess regions (R shown in FIG. 5B). The hollowed blocking insulating layer 321 may be conformally formed such that the plurality of recess regions R shown in FIG. 5B may be opened. Subsequently, a hollowed data storage layer 323 may be formed inside the hollowed blocking insulating layer 321 such that the plurality of recess regions (R shown in FIG. 5B) opened by the hollowed blocking insulating layer 321 are filled.

The hollowed blocking insulating layer 321 may include oxide. In an embodiment, the hollowed blocking insulating layer 321 may include at least one of silicon oxide and metal oxide. The hollowed data storage layer 323 may include at least one of insulating layers including a charge trap layer, a floating gate layer, and a conductive nano dot. The charge trap layer may include silicon nitride, and the floating gate layer may include a silicon layer.

Figure 5D:
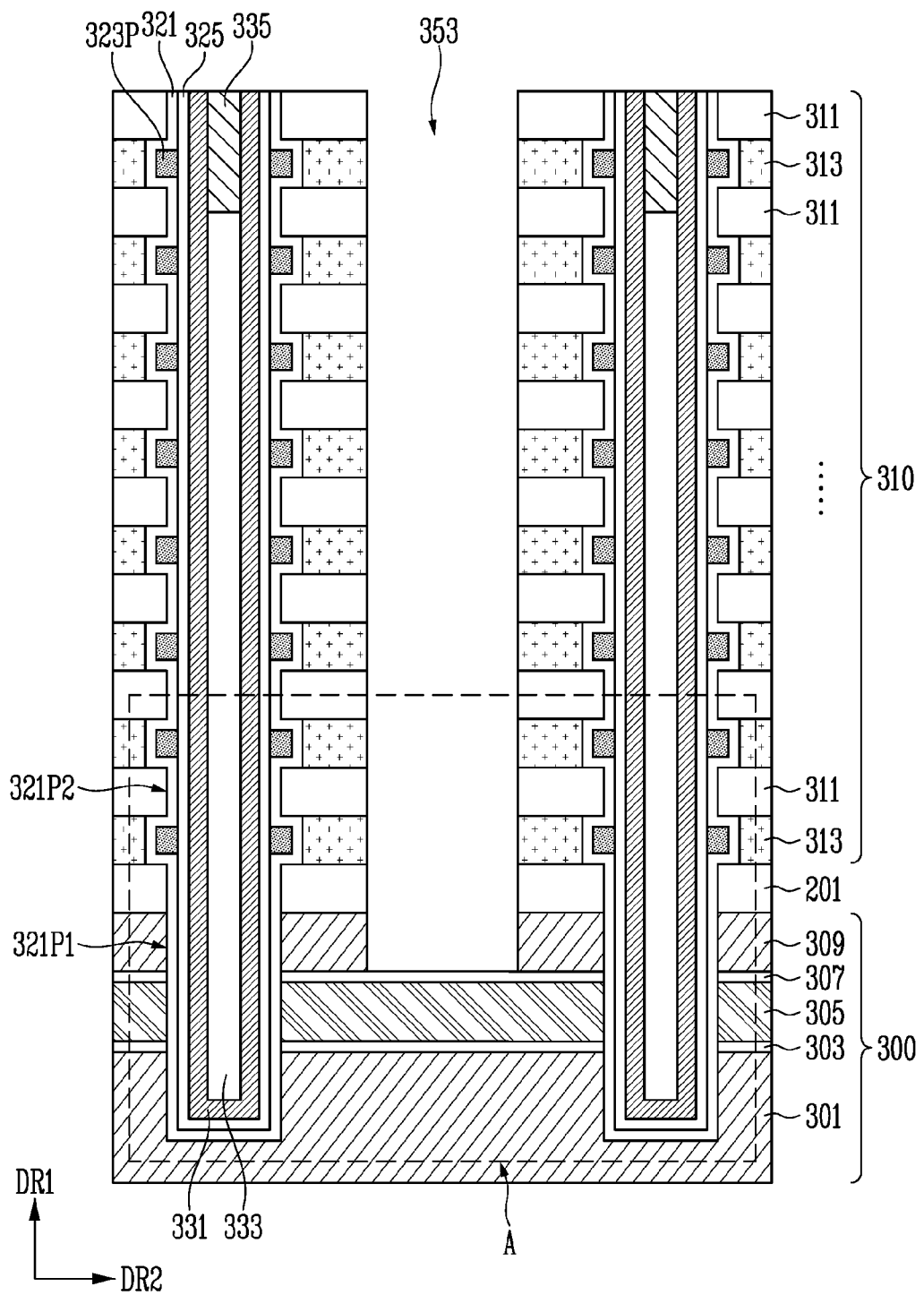

Referring to FIG. 5D, the hollowed data storage layer 323 shown in FIG. 5C may be isolated into a plurality of data storage patterns 323P by removing a portion of the hollowed data storage layer 323 shown in FIG. 5C inside the hole H. The plurality of data storage patterns 323P may respectively correspond to the second material layers 313, and remain inside the plurality of recess regions R shown in FIG. 5B.

Subsequently, a hollowed tunnel insulating layer 325 may be formed inside the hollowed data storage layer isolated into the plurality of data storage patterns 323P. The hollowed tunnel insulating layer 325 may include oxide having a dielectric constant lower than a dielectric constant of the hollowed blocking insulating layer 321. In an embodiment, the hollowed tunnel insulating layer 325 may include silicon oxide.

Subsequently, a channel layer 331 may be formed inside the hollowed tunnel insulating layer 325. The channel layer 331 may include a semiconductor layer such as silicon or germanium. When a central region of the hollowed tunnel insulating layer 325 is opened by the channel layer 331, a core insulating layer 333 and a capping semiconductor layer 335 may be formed in the central region of the hollowed tunnel insulating layer 325.

According to the above-described process, the hollowed blocking insulating layer 321 may include a first part 321P1 inside the preliminary doped semiconductor structure 300 and a second part 321P2 extending in the first direction DR1 from the first part 321P1. The second part 321P2 may penetrate the plurality of first material layers 201 and 311 and the plurality of second material layers 313. The hollowed tunnel insulating layer 325 may be in contact with the first part 321P1 of the hollowed blocking insulating layer 321. In an embodiment, the hollowed tunnel insulating layer 325 and the hollowed blocking insulating layer 321 may be in contact with each other inside each of the lower layer 301, the sacrificial layer 305, and the upper layer 309. Also, the hollowed tunnel insulating layer 325 may be locally in contact with the second part 321P2 of the hollowed blocking insulating layer 321. In an embodiment, the hollowed tunnel insulating layer 325 may be in contact with the second part 321P2 of the hollowed blocking insulating layer 321 at a level at which each of the plurality of material layers 201 and 311 is disposed. Consequently, the data storage pattern 323P may be excluded between the hollowed blocking insulating layer 321 and the hollowed tunnel insulating layer 325 at a level at which the preliminary doped semiconductor structure 300 is disposed.

After at least one of the channel layer 331, the core insulating layer 333, and the capping semiconductor layer 335 is formed inside the hollowed tunnel insulating layer 325, a slit 353 may be formed to penetrate the preliminary gate stack structure 310, the gate insulating layer 201, and the upper layer 309.

The process of forming the slit 353 may include a first etching process of etching the plurality of first material layers 201 and 311 and the plurality of second material layers 313 and a second etching process of etching the upper layer 309, The upper layer 309 may serve as an etch stop layer during the first etching process. Accordingly, in an embodiment, the depth of the slit 353 may be precisely controlled.

FIGS. 6A, 7A, 8A, and 9A are enlarged sectional views illustrating an embodiment of subsequent processes performed after the process shoe n in FIG. 5D. FIGS. 6B, 7B, 8B, and 9B are enlarged sectional views illustrating an embodiment of the subsequent processes performed after the process shown in FIG. 5D. FIGS. 6A to 9A and 6B to 9B enlarge and illustrate region A shown in FIG. 5D.

Figure 6A:
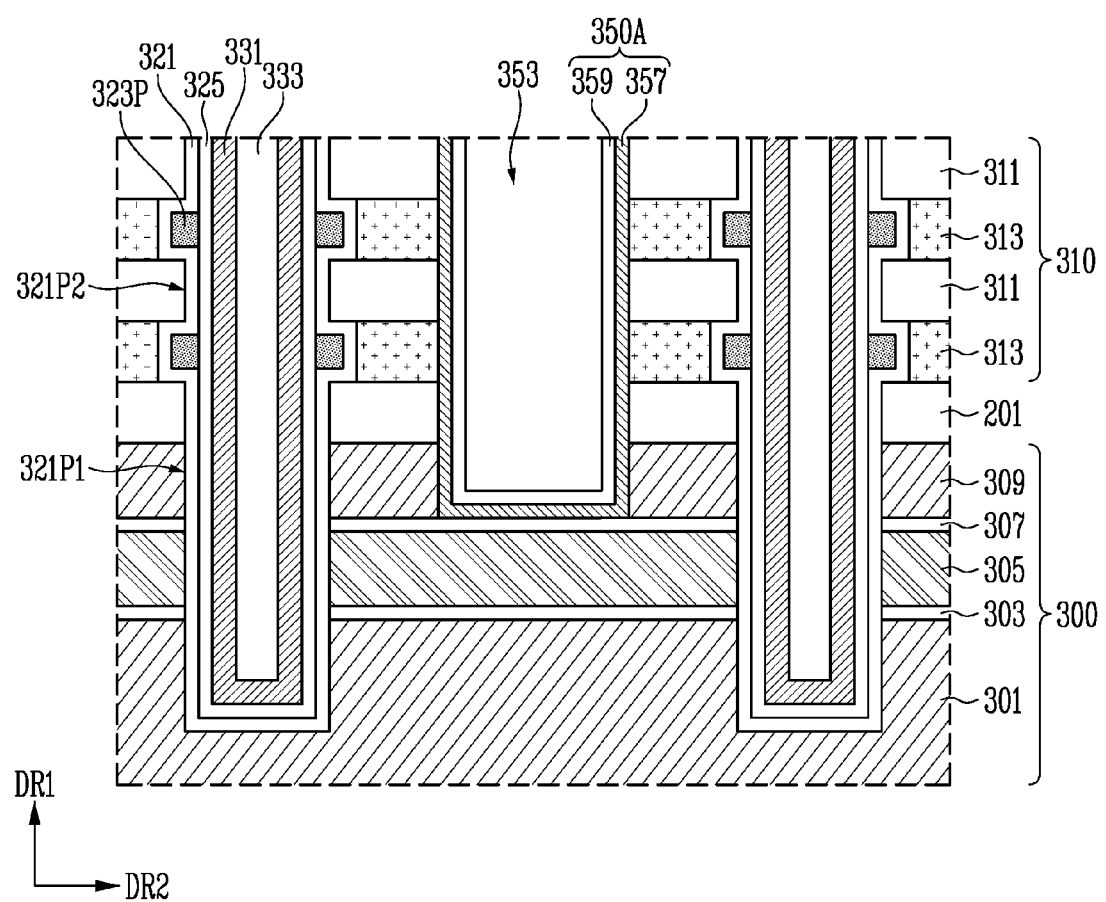
FIGS. 6A, 7A, 8A, and 9A are enlarged sectional views illustrating an embodiment of subsequent processes performed after the process shown in FIG. 5D.
Figure 6B:
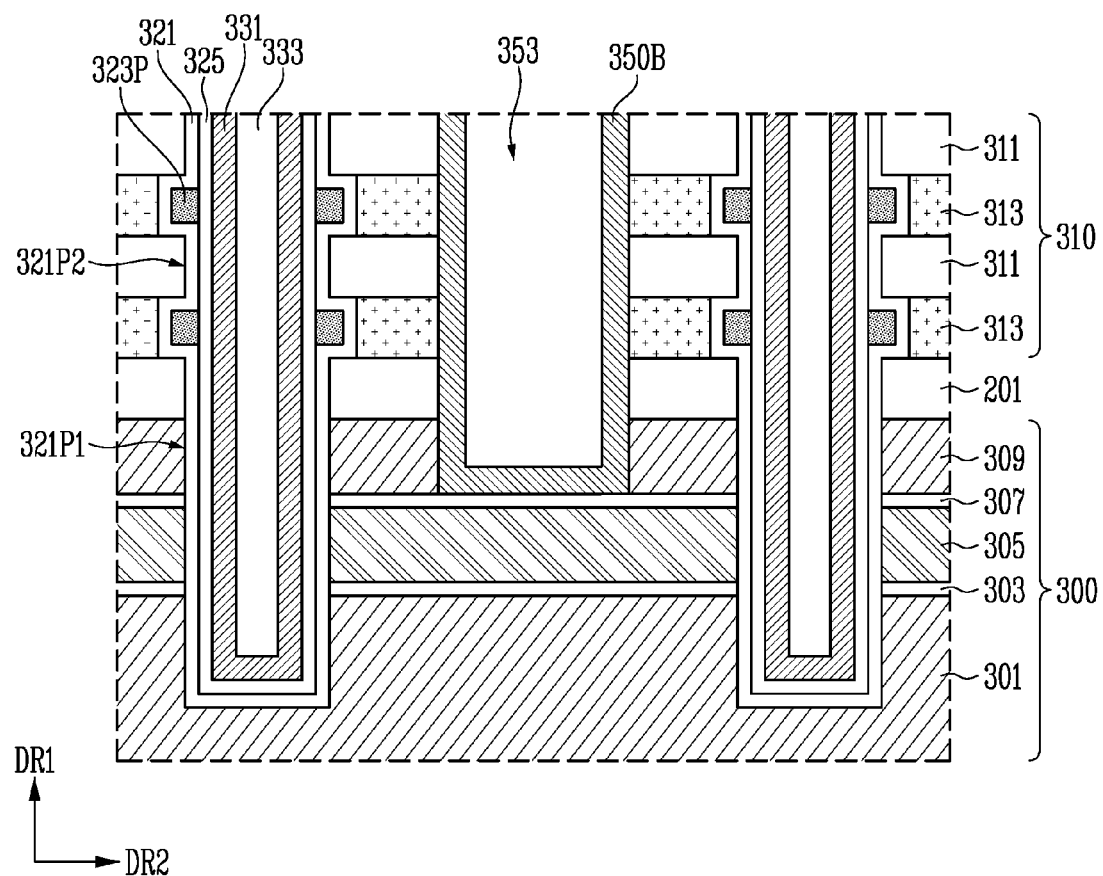
FIGS. 6B, 7B, 8B, and 9B are enlarged sectional views illustrating an embodiment of the subsequent processes performed after the process shown in FIG. 5D.

Referring to FIGS. 6A and 6B, a protective structure 350A or 350B may be formed along a surface of the slit 353.

Referring to FIG. 6A, in an embodiment, the protective structure 305A may be formed as a double layer including a first protective layer 357 and a second protective layer 359. The first protective layer 357 may extend along a sidewall and a bottom surface of the slit 353, and the second protective layer 359 may extend along the first protective layer 357, The first protective layer 357 may include a material having an etch selectivity with respect to the hollowed blocking insulating layer 321 and the hollowed tunnel insulating layer 325. In an embodiment, the first protective layer 357 may include nitride. Like the hollowed blocking insulating layer 321 and the hollowed tunnel insulating layer 325, the second protective layer 359 may include an oxide-based material.

Referring to FIG. 6B, in an embodiment, the protective structure 350B may be formed as a single layer. The protective structure 350B as the single layer may include a material having an etch selectivity with respect to the hollowed blocking insulating layer 321 and the hollowed tunnel insulating layer 325. In an embodiment, the protective structure 350B may include nitride. The protective structure 350B as the single layer may be formed to have a thickness thicker than a thickness of each of the hollowed blocking insulating layer 321 and the hollowed tunnel insulating layer 325.

Figure 7A:
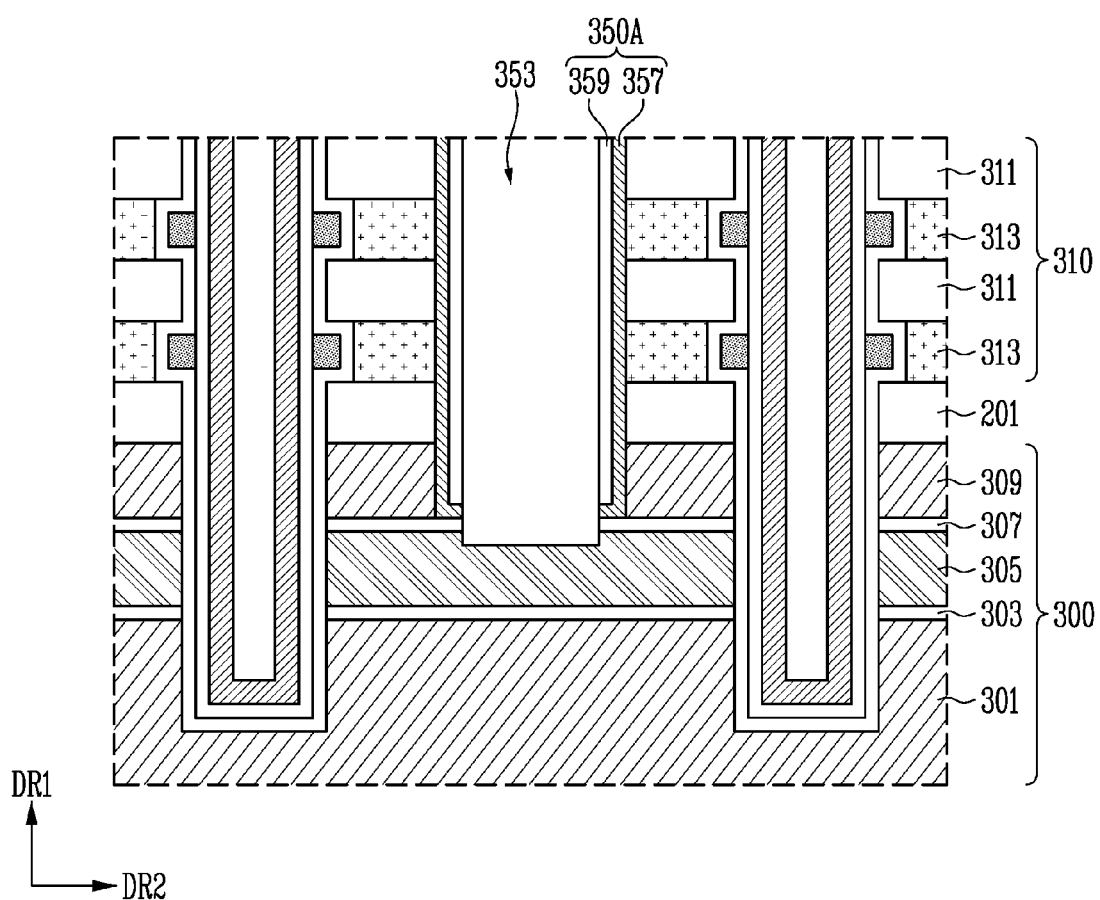
Figure 7B:
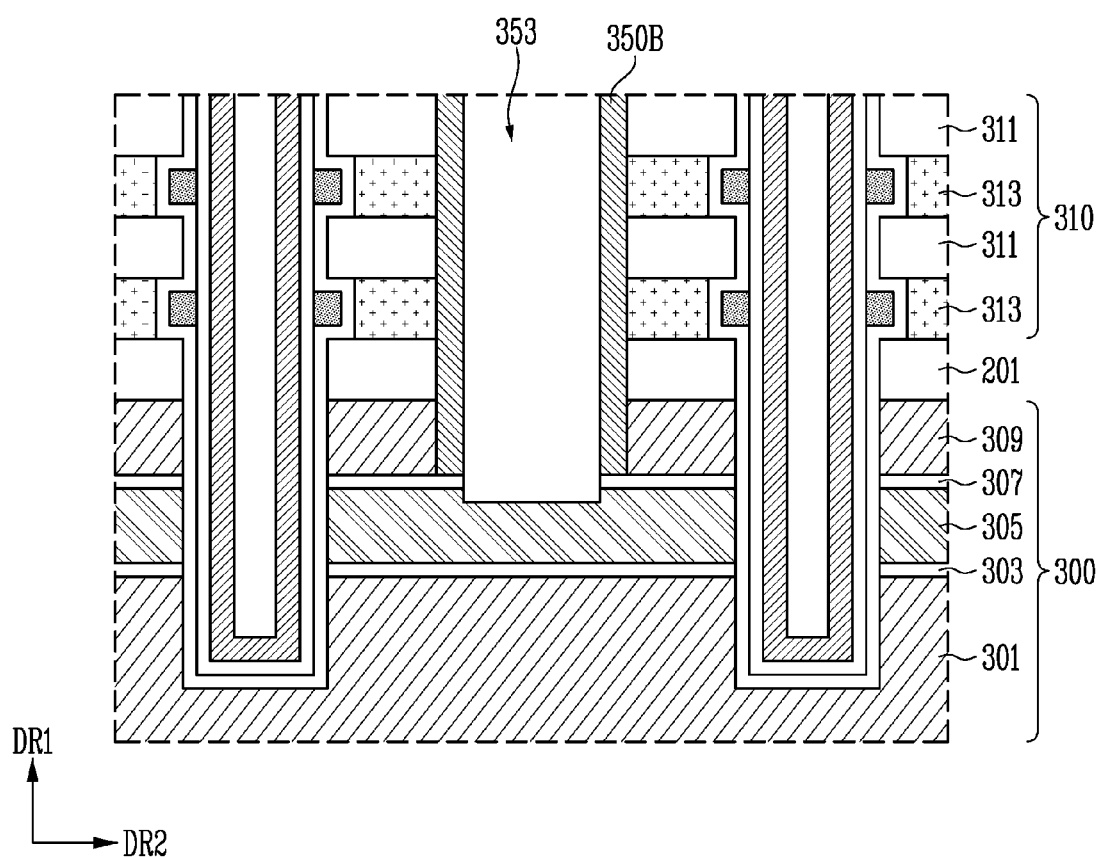

Referring to FIGS. 7A and 7B, a portion of the protective structure 350A or 350B may be removed through a blanket etching process such as etch-back such that the bottom surface of the slit 353 may be exposed. The protective structure 350A or 350B may remain on the side tall of the slit 353.

When the preliminary doped semiconductor structure 300 includes the upper protective layer 307, the sacrificial layer 305 may be exposed by etching the upper protective layer 307 through the slit 353.

Figure 8A:
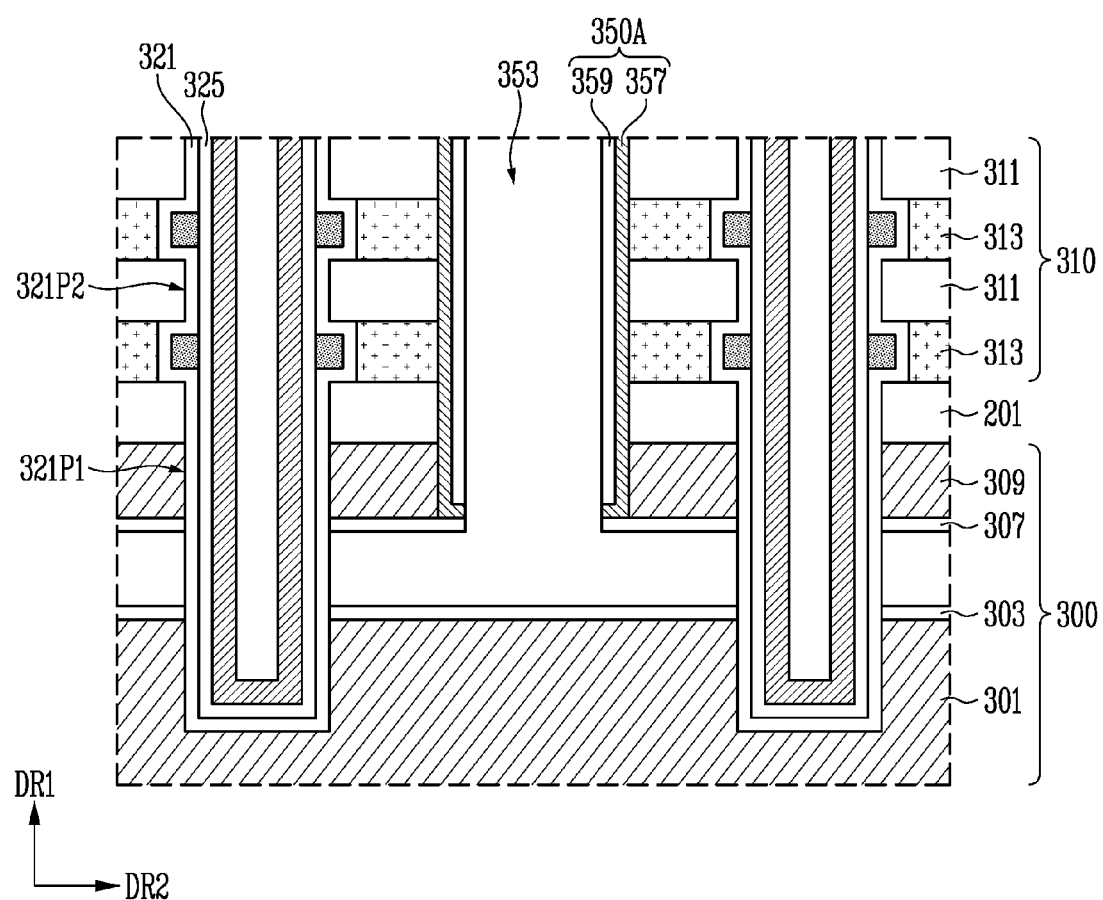
Figure 8B:
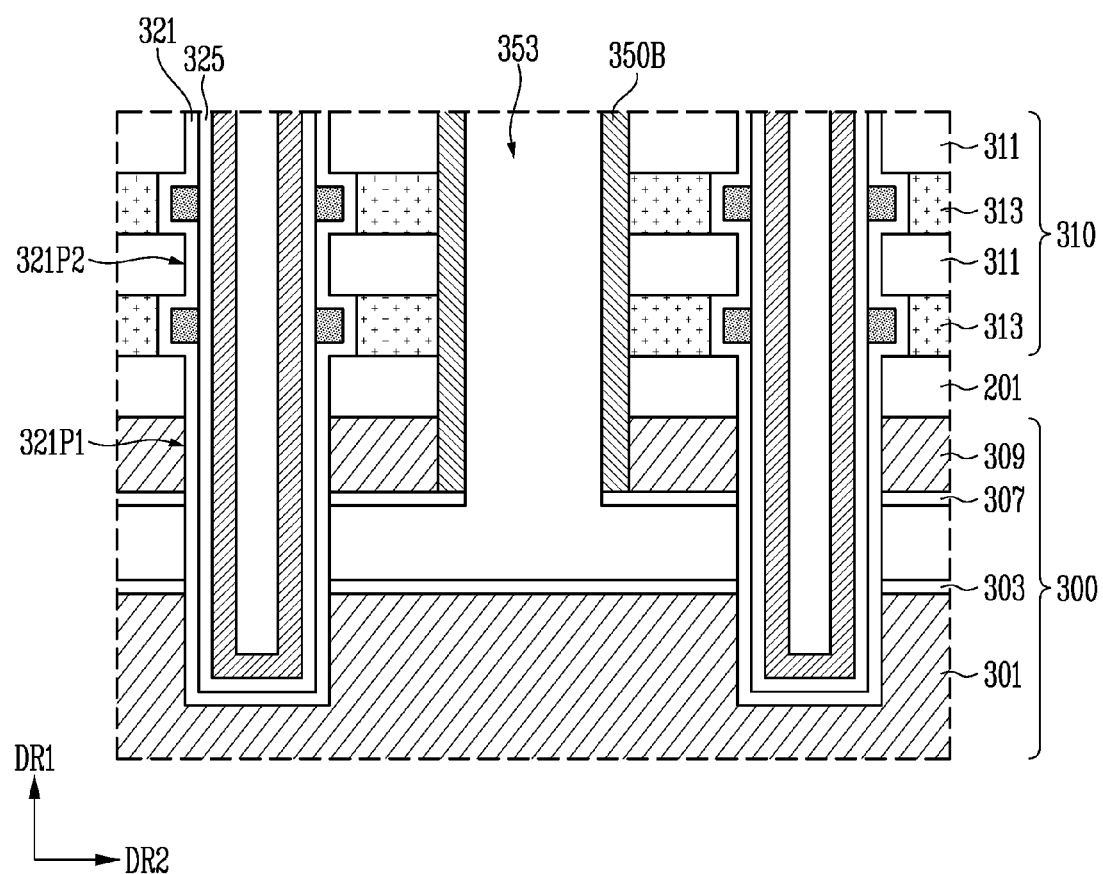

Referring to FIGS. 8A and 8B, the sacrificial layer 305 shown in FIG. 7A or 7B may be selectively removed. Accordingly, the lower protective layer 303, the upper protective layer 307, and the hollowed blocking insulating layer 321 may be exposed.

Figure 9A:
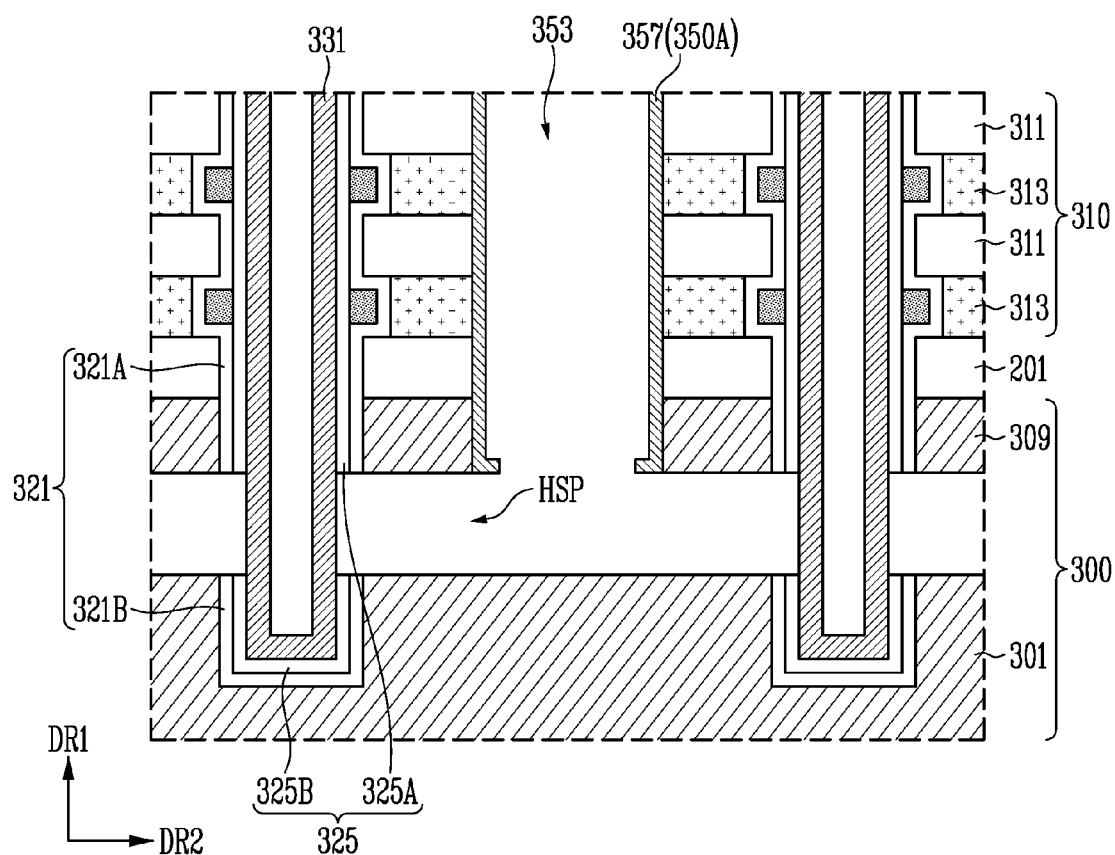
Figure 9B:
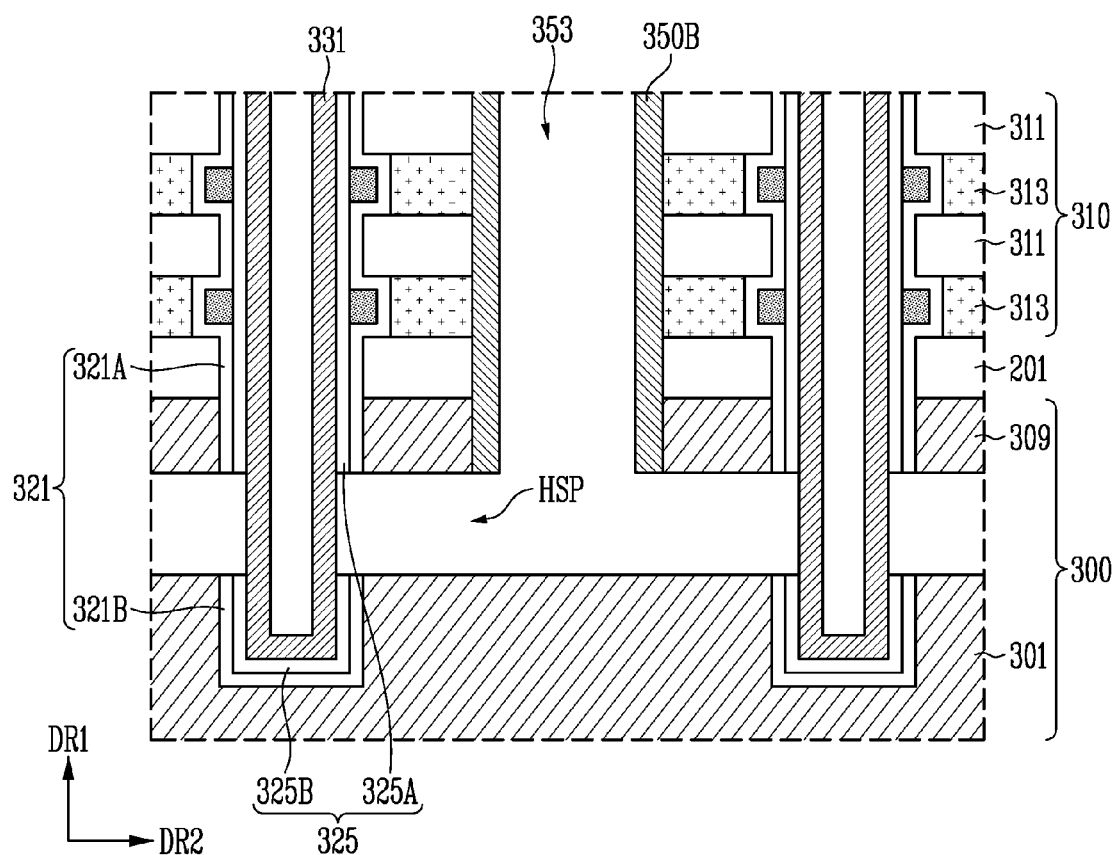

Referring to FIGS. 9A and 9B, the hollowed blocking insulating layer 321 and the hollowed tunnel insulating layer 325 may be etched through a region in which the sacrificial layer is removed through an etching process using the protective structure 350A or 350B as an etch barrier. While the oxide-based hollowed blocking insulating layer 321 and the oxide-based hollowed tunnel insulating layer 325 are etched, the oxide-based lower protective layer 303 and the oxide-based upper protective layer 307, which are shown in FIG. 8A or 8B, may be removed. Accordingly, the channel layer 331 may be exposed through a horizontal space HSP between the lower layer 301 and the upper layer 309.

The hollowed blocking insulating layer 321 may be isolated into a first blocking insulating pattern 321A and a second blocking insulating pattern 321E by the horizontal space HSP. The hollowed tunnel insulating layer 325 may be isolated into a first tunnel insulating pattern 325A and a second tunnel insulating pattern 325B by the horizontal space HSP.

In accordance with an embodiment, a thickness loss of the first protective layer 357 of the protective structure 350A may be prevented or reduced by the second protective layer 359 shown in FIG. 8A. Because the second protective layer 359 shown in FIG. 8A is an oxide-based layer, the second protective layer 359 may be removed while the hollowed blocking insulating layer 321 and the hollowed tunnel insulating layer 325 are etched. Accordingly, the first protective layer 357 may be exposed. In an embodiment, the first protective layer 357 may remain, thereby protecting the preliminary gate stack structure 310.

In accordance with another embodiment, a partial thickness of the protective structure 350E having an etch selectivity with respect to the hollowed blocking insulating layer 321 and the hollowed tunnel insulating layer 325 may be lost. However, in an embodiment, the protective structure 350E is not completely removed but may remain, thereby protecting the preliminary gate stack structure 310.

Figure 10A:
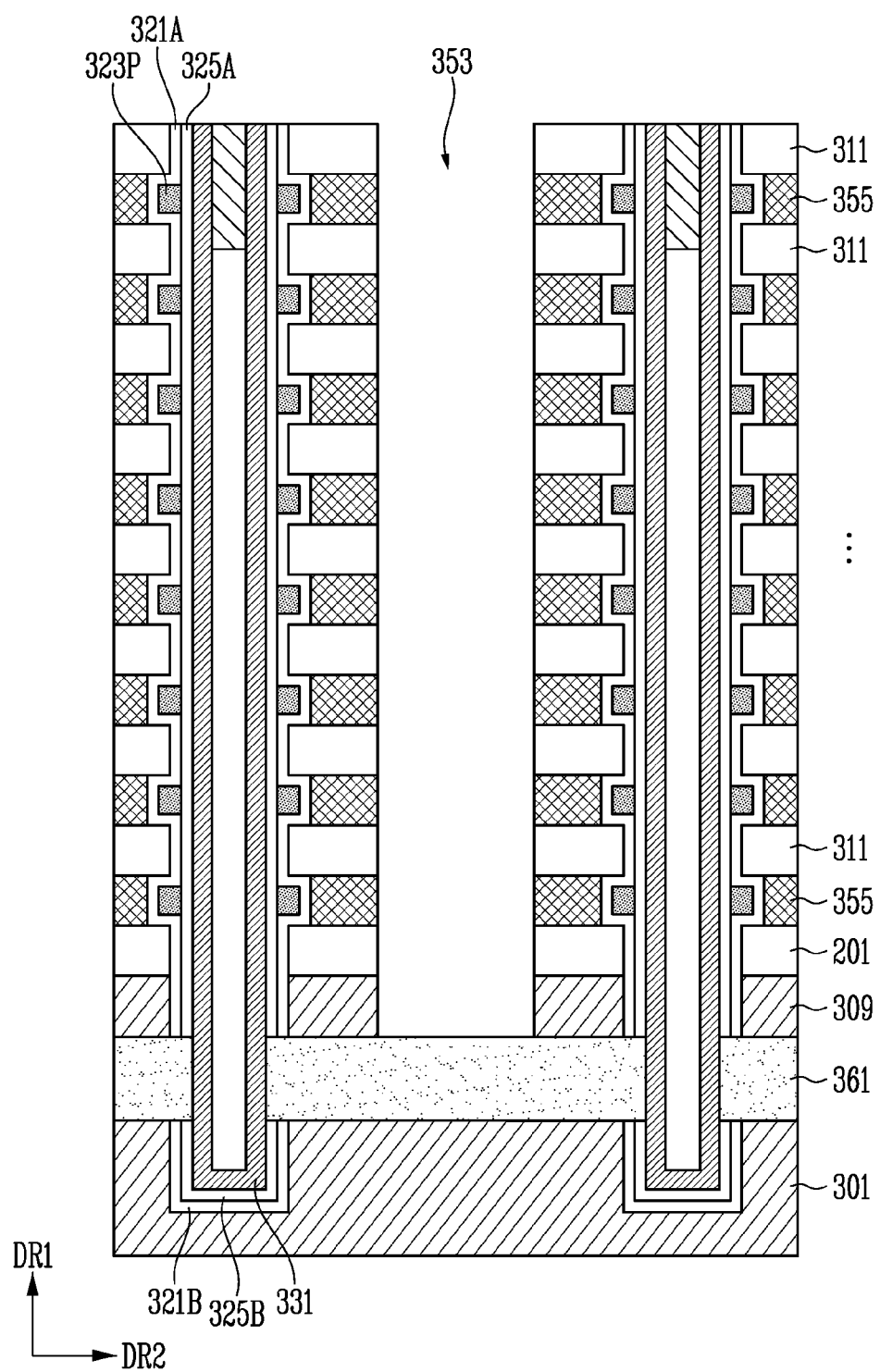
FIGS. 10A and 10B are sectional views illustrating an embodiment of subsequent processes performed after the process shown in FIG. 9A or 9B.
Figure 10B:
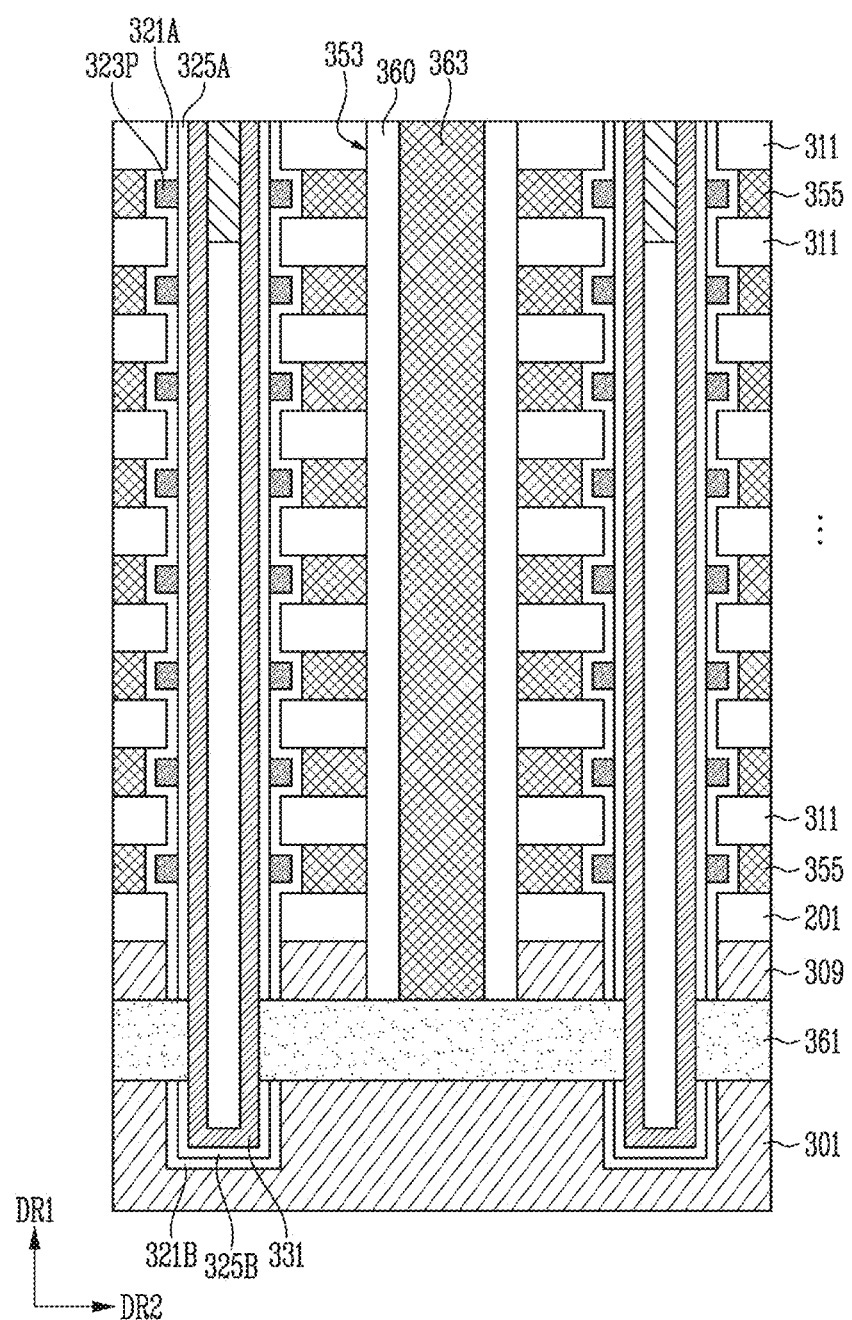

FIGS. 10A and 10B are sectional views illustrating an embodiment of subsequent processes performed after the process shown in FIG. 9A or 9B.

Referring to FIG. 10A, a doped semiconductor layer may be formed inside the horizontal space HSP shown in FIG. 9A or 9B. Accordingly, a doped channel contact layer 361 in contact with the channel layer 331 may be formed. The doped channel contact layer 361 may extend in a direction (e.g., DR2) intersecting the channel layer 331 between the upper layer 309 and the lower layer 301. The doped channel contact layer 361 may penetrate the sacrificial layer 305 of the preliminary doped semiconductor structure 300 shown in FIG. 5D and may penetrate a portion of each of the hollowed blocking insulating layer 321 and the hollowed tunnel insulating layer 325, which are shown in FIG.

Subsequently, the plurality of second material layers 313 of the preliminary gate stack structure 310 shown in FIG. 9A or 9B may be exposed by removing the protective structure 350A or 3506 shown in FIG. 9A or 9B, When each of the plurality of second material layers 313 shown in FIG. 9A or 9B is a sacrificial material, the plurality of second material layers 313 may be replaced with a plurality of conductive layers 355 through the slit 353.

Referring to FIG. 10B, a sidewall insulating layer 360 may be formed on the sidewall of the slit 353 to cover the plurality of conductive layers 355. Subsequently, a source contact structure 363 may be formed, which is connected to the doped channel contact layer 361.

Figure 11:
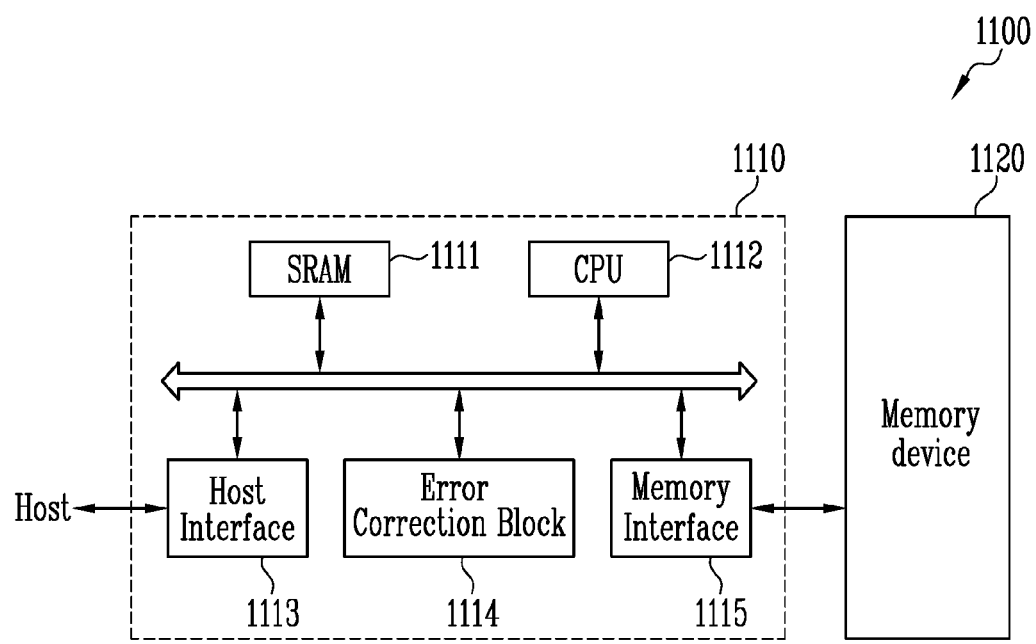
FIG. 11 is a block diagram illustrating a configuration of a memory system in accordance with an embodiment of the present disclosure.

FIG. 11 is a block diagram illustrating a configuration of a memory system in accordance with an embodiment of the present disclosure.

Referring to FIG. 11, the memory system 1100 includes a memory device 1120 and a memory controller 1110.

The memory device 1120 may be a multi-chip package configured with a plurality of flash memory chips. The memory device 1120 may include a gate stack structure over a doped semiconductor structure, a channel layer which penetrates the gate stack structure and extends to the inside of the doped semiconductor structure, and a blocking insulating pattern and a tunnel insulating pattern, which extend between the channel layer and the doped semiconductor structure from between the channel layer and the gate stack structure, and have regions in contact with each other. Also, the memory device 1120 may include a data storage pattern which is disposed between the channel layer and the doped semiconductor structure, and is interposed between the blocking insulating pattern and the tunnel insulating pattern at a level at which the gate stack structure is disposed.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120, and corrects the detected error. The memory interface 1115 interfaces with the memory device 1120. The memory controller 1110 may further include a Read Only Memory (ROM) for storing code data for interfacing with the host, and the like.

The memory system 1100 configured as described above may be a memory card or a Solid State Disk (SSD), in which the memory device 1120 is combined with the memory controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 12:
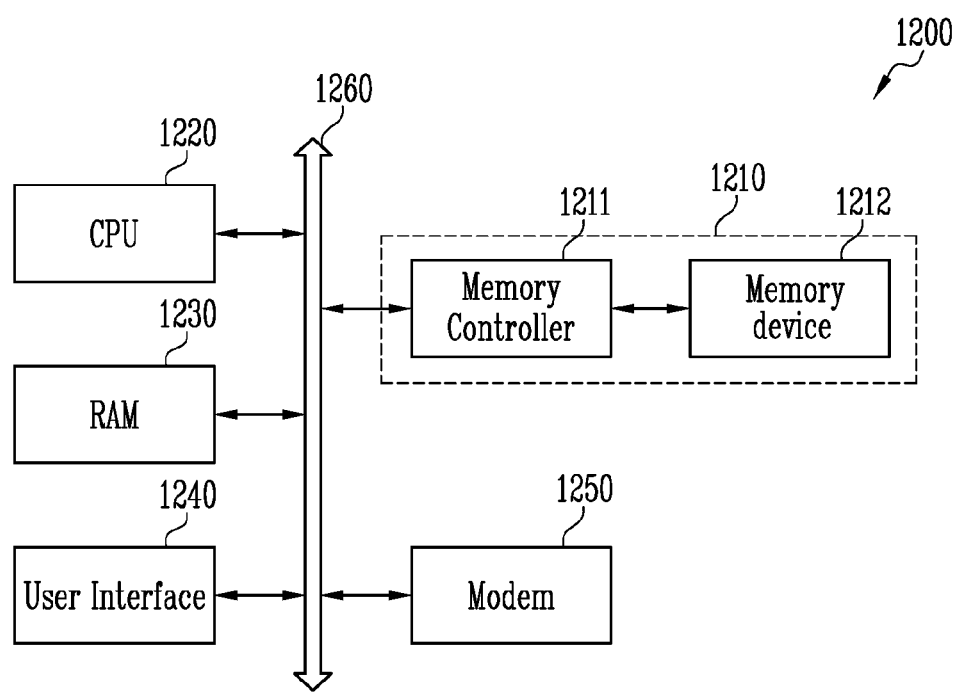
FIG. 12 is a block diagram illustrating a configuration of a computing system in accordance with an embodiment of the present disclosure.

FIG. 12 is a block diagram illustrating a configuration of a computing system in accordance with an embodiment of the present disclosure.

Referring to FIG. 12, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may have the same configuration as a memory device 1212 and a memory controller 1211. The memory device 1212 may be configured identically to the memory device 1120 described above with reference to FIG. 11. The memory controller 1211 may have the same configuration as the memory controller 1110 described above with reference to FIG. 11.

In accordance with the present disclosure, in various embodiments, a stack structure of a plurality of material layers may be protected by using a protective structure as a double layer or a single layer, which is disposed on a sidewall of a slit, so that a manufacturing process may be simplified as compared with a case where a protective structure as a multi-layer including three or more layers is introduced.

What is claimed is:

1. A method of manufacturing a semiconductor memory device, the method comprising:
    alternately stacking a plurality of first material layers and a plurality of second material layers in a first direction over a preliminary doped semiconductor structure;
    forming a hollowed blocking insulating layer penetrating the plurality of first material layers and the plurality of second material layers, the hollowed blocking insulating layer extending to the inside of the preliminary doped semiconductor structure;
    forming a plurality of data storage patterns on levels where the plurality of second material layers are disposed, wherein an inner wall of the hollowed blocking insulating layer is partially covered by the plurality of data storage patterns;
    forming a hollowed tunnel insulating layer to cover the plurality of data storage patterns and the inner wall of the hollowed blocking insulating layer;
    forming a channel layer inside the hollowed tunnel insulating layer;
    forming a slit penetrating the plurality of first material layers and the plurality of second material layers;
    forming a protective structure as one of a double layer and a single layer on a sidewall of the slit; and
    forming a doped channel contact layer penetrating a portion of the preliminary doped semiconductor structure in a direction intersecting the channel layer, the doped channel contact layer being in contact with the channel layer.

2. The method of claim 1, wherein the double layer includes a first protective layer extending along the side all of the slit and a second protective layer extending along the first protective layer,
    wherein the first protective layer includes a material having an etch selectivity with respect to the hollowed blocking insulating layer and the hollowed tunnel insulating layer, and
    wherein each of the hollowed blocking insulating layer, the hollowed tunnel insulating layer, and the second protective layer includes oxide.

3. The method of claim 2, wherein the first protective layer includes nitride.

4. The method of claim 1, wherein the single layer includes a material having an etch selectivity with respect to the hollowed blocking insulating layer and the hollowed tunnel insulating layer.

5. The method of claim 4, wherein the single layer includes nitride.

6. The method of claim 1, wherein the preliminary doped semiconductor structure includes a lower layer, a sacrificial layer, and an upper layer, which are stacked in the first direction, and
    wherein the hollowed blocking insulating layer and the hollowed tunnel insulating layer are in contact with each other inside each of the lower layer, the sacrificial layer, and the upper layer.

7. The method of claim 6, wherein the slit penetrates the upper layer, and
    wherein the forming of the doped channel contact layer includes:
    removing the sacrificial layer through the slit such that the hollowed blocking insulating layer is exposed;
    etching the hollowed blocking insulating layer and the hollowed tunnel insulating layer through a region in which the sacrificial layer is removed through an etching process using the protective structure as an etch barrier; and
    forming a doped semiconductor layer in a region in which the hollowed blocking insulating layer and the hollowed tunnel insulating layer are etched and a region in which the sacrificial layer is removed.

8. The method of claim 1, wherein the hollowed blocking insulating layer includes a first part inside the preliminary doped semiconductor structure and a second part extending to penetrate the plurality of first material layers and the plurality of second material layers from the first part, and
    wherein the hollowed tunnel insulating layer is in contact with the first part of the hollowed blocking insulating layer.

9. The method of claim 8, wherein the hollowed tunnel insulating layer is in contact with the second part of the hollowed blocking insulating layer at a level at which each of the plurality of first material layers is disposed.

10. The method of claim 1, further comprising:
    replacing the plurality of second material layers with a plurality of conductive layers through the slit;
    forming a sidewall insulating layer on the sidewall of the slit to cover the plurality of conductive layers; and
    forming a source contact structure connected to the doped channel contact layer inside the slit.

11. A semiconductor memory device comprising:
    a doped semiconductor structure;
    a gate stack structure including a plurality of conductive layers stacked in a first direction over the doped semiconductor structure;
    a channel layer including a first part and a second part extending in the first direction from the first part to penetrate the gate stack structure;
    a first tunnel insulating pattern extending along an outer wall of the second part of the channel layer;

a plurality of data storage patterns interposed between the plurality of conductive layers and the first tunnel insulating pattern; and a first blocking insulating pattern interposed between each of the plurality of data storage pattern and the gate stack structure, wherein at least a portion of the first part is located inside the doped semiconductor structure, wherein the doped semiconductor structure includes a contact surface in contact with the channel layer, and wherein the first blocking insulating pattern extends to a first region between a lowermost conductive layer adjacent to the doped semiconductor structure among the plurality of conductive layer and the contact surface, and is in contact with the first tunnel insulating pattern in the first region.

12. The semiconductor memory device of claim 11, wherein the first blocking insulating pattern extends to a second region between the plurality of conductive layers adjacent to each other in the first direction, and is in contact with the first tunnel insulating pattern in the second region.

13. The semiconductor memory device of claim 11, wherein the doped semiconductor structure includes:

a doped channel contact layer having a sidewall corresponding to the contact surface;

an upper layer between the doped channel contact layer and the gate stack structure; and a lower layer spaced apart from the upper layer with the doped channel contact layer interposed therebetween, and wherein the first tunnel insulating pattern and the first blocking insulating pattern are in contact with each other between the upper layer and the channel layer.

14. The semiconductor memory device of claim 13, further comprising:

a second tunnel insulating pattern between the first part of the channel layer and the lower layer; and a second blocking insulating pattern interposed between the second tunnel insulating pattern and the lower layer, the second blocking insulating pattern being in contact with the second tunnel insulating pattern.

15. The semiconductor memory device of claim 11, wherein the gate stack structure further includes a plurality of interlayer insulating layers alternately disposed in the first direction with the plurality of conductive layers, and wherein the first blocking insulating pattern and the first tunnel insulating pattern are in contact with each other between the plurality of interlayer insulating layers and the second part of the channel layer.

* * * * *